United States Patent
Garg et al.

(10) Patent No.: US 7,281,085 B1
(45) Date of Patent: Oct. 9, 2007

(54) METHOD AND DEVICE FOR VIRTUALIZATION OF MULTIPLE DATA SETS ON SAME ASSOCIATIVE MEMORY

(75) Inventors: Ashish Garg, San Jose, CA (US); Pankaj Gupta, Palo Alto, CA (US)

(73) Assignee: Netlogic Microsystems, Inc., Mountain View, CA (US)

( * ) Notice: Subject to any disclaimer, the term of this patent is extended or adjusted under 35 U.S.C. 154(b) by 333 days.

(21) Appl. No.: 11/047,793

(22) Filed: Jan. 31, 2005

(51) Int. Cl.
*G06F 12/00* (2006.01)

(52) U.S. Cl. ........................ 711/108; 370/235

(58) Field of Classification Search ............... None
See application file for complete search history.

(56) References Cited

U.S. PATENT DOCUMENTS

| | | | |
|---|---|---|---|
| 6,308,148 B1 | 10/2001 | Bruins et al. | |
| 6,484,170 B2* | 11/2002 | Abdat | 707/6 |
| 6,633,563 B1* | 10/2003 | Lin et al. | 370/389 |
| 6,643,260 B1 | 11/2003 | Kloth et al. | |
| 6,667,975 B1 | 12/2003 | DeJager et al. | |
| 6,697,803 B2* | 2/2004 | Abdat | 707/6 |
| 6,798,746 B1 | 9/2004 | Kloth et al. | |
| 6,826,147 B1 | 11/2004 | Nandy et al. | |
| 6,850,974 B2 | 2/2005 | Schweitzer et al. | |
| 6,870,812 B1 | 3/2005 | Kloth et al. | |
| 2001/0002476 A1* | 5/2001 | Abdat | 711/108 |
| 2003/0046500 A1* | 3/2003 | Abdat | 711/154 |
| 2004/0123024 A1* | 6/2004 | King | 711/108 |
| 2006/0080499 A1* | 4/2006 | King | 711/108 |

OTHER PUBLICATIONS

U.S. Appl. No. 10/938,289, filed Sep. 2004, Paul et al.
U.S. Appl. No. 10/950,323, filed Sep. 2004, Birman et al.
Foundry Networks, Inc. "sFlow Technology: an Overview", http://www.foundrynet.com/technologies/sFlow/definition.html, Oct. 11, 2004.
Juniper Networks, Inc. *JUNOSe Routing Protocols Configuration Guide, Vol. 1*, "Configuring J-flow Statistics —Overview", http://www.juniper.net/techpubs/software/erx/junose53/swconfig-routing-vol1/html/ip-jflow-stats-config.html#28504, Oct. 11, 2004.
Cisco Systems, Inc. *Netflow Services and Applications —White Paper*, 1999.

* cited by examiner

*Primary Examiner*—Kevin Verbrugge
(74) *Attorney, Agent, or Firm*—Haverstock & Owens LLP

(57) ABSTRACT

A system (200) can provide data aggregation with a single primary table (206) formed in a content addressable memory (CAM) section (202). Within a primary table (206) CAM entries can be part of a primary table, one or more aggregate tables, or both. In one arrangement, valid bits in each CAM entry can indicate which particular schemes a CAM entry belongs to (primary table, or any of the aggregate tables). Associated data for each table can be stored in a RAM section (204) and can be accessed according to an offset address generated according to a scheme value (i).

32 Claims, 27 Drawing Sheets

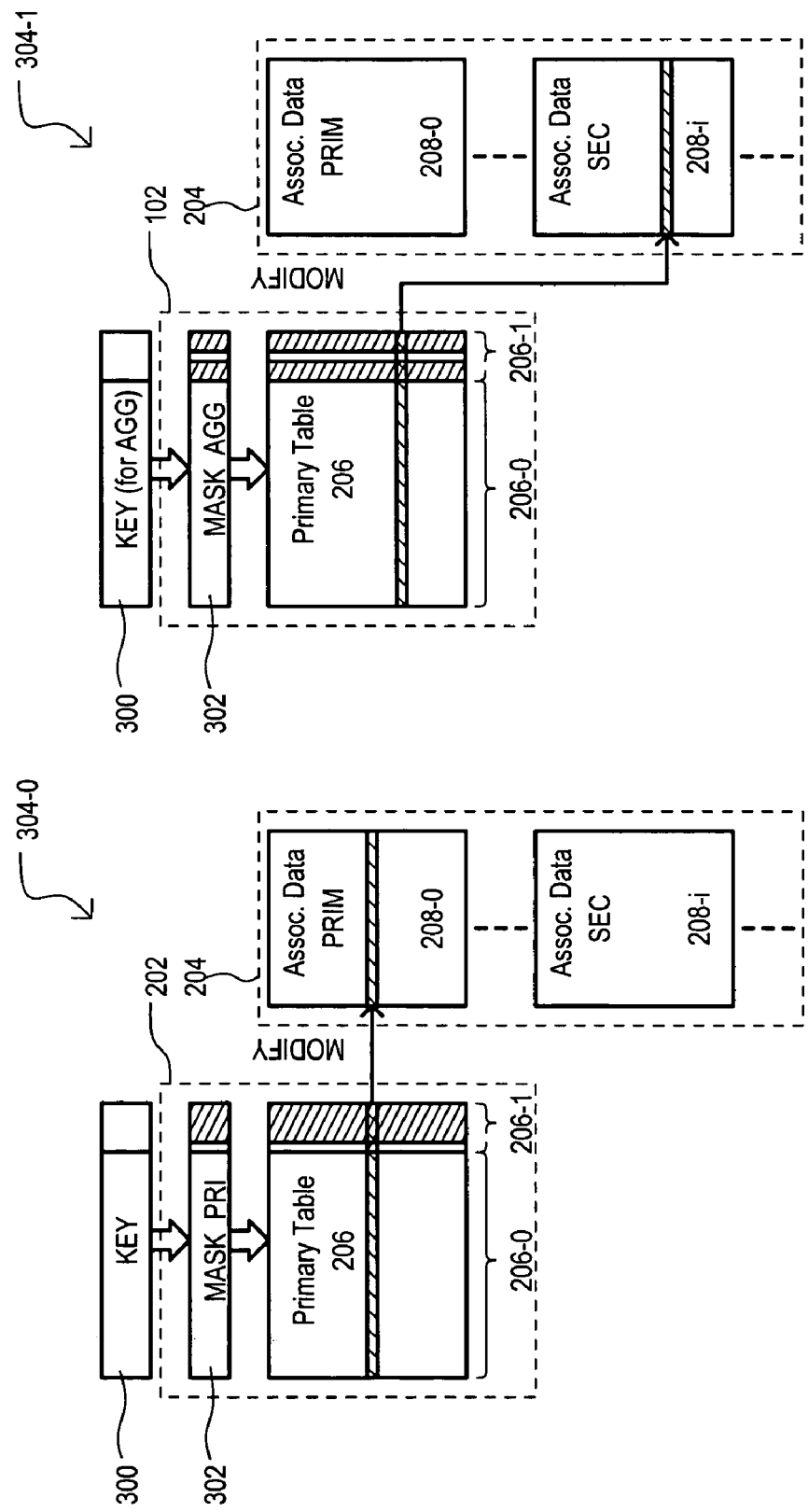

| Key K with several fields | |
|---|---|
| $F_1$ $F_2$ $F_3$ ...... | $F_k$ |

FIG. 6A

| Key K' generated by NSearch (K,i) | | | | Valid Bits (Vld_bit) | | | |
|---|---|---|---|---|---|---|---|
| $F_1 =$ $f_{11}..f_{1a}$ | $F_2 =$ $f_{21}..f_{2b}$ | $F_3 =$ $f_{31}..f_{3c}$ | ... | $F_k =$ $f_{k1}...f_{km}$ | $V_0 = 0$ $V_1 = 0$ $V_2 = 0$ | $...V_i = 1....$ | $V_m = 0$ |

FIG. 6B

| $i^{th}$ Global Mask configured by NSearch (K,i) | | | | | Valid Bits | | | | |
|---|---|---|---|---|---|---|---|---|---|
| Key K with several fields | | | | | | | | | |
| $F_1 = 11..11$ | $F_2 = 11..11$ | $F_3 = 11..11$ | ...... | $F_k = 11..11$ | $V_0 = 0$ | $V_1 = 0$ | $V_2 = 0$ | $...V_i = 1...$ | $V_m = 0$ |

FIG. 6C

DRead (AddPtr[i] + Index)

WRITE_DATA = OLD_DATA + NEW_DATA

DWrite (AddPtr[i] + index, WRITE_DATA)

DWrite (NEW_ADD, NEW_DATA)

DRead (NEW_ADD)

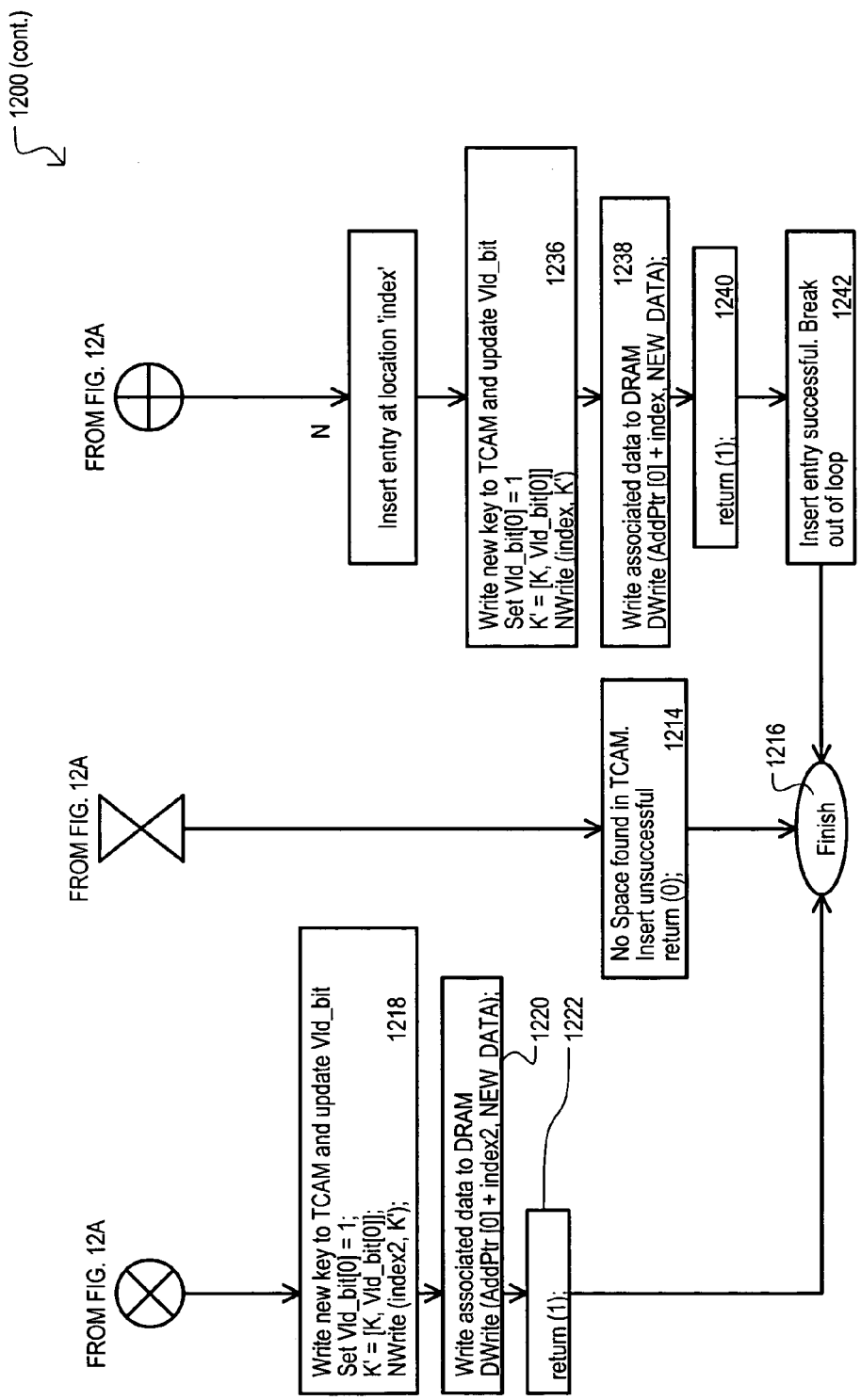

| Line Rate (Gbps) | Peak Packets per second (Mpps) Ethernet / Packet over Sonet (PoS) | Average Packet Size (bits) | Average Packets per Flow | Average Packets per Second (pps) | Average Flow rate (Flows per second) | Average Update rate at 100% utilization | Average Update rate (Rounded Off) | Average Look-up rates for the Primary Table | Average Look-up rates for the Secondary Table |
|---|---|---|---|---|---|---|---|---|---|
| 1 | 1.5/2.5 | 4608 | 17 | 210 K | 12.4 K | 24.8 K | 25 K | 25 K | 12.5K |
| 2.5 | 3.75/6.25 | 4608 | 17 | 542 K | 31 K | 62 K | 75 K | 75 K | 37.5K |
| 10 | 15/25 | 4608 | 17 | 2.1 M | 124 K | 248 K | 250 K | 250 K | 125K |
| 24 | 36/60 | 4608 | 17 | 5.2 M | 298 K | 596 K | 600 K | 600 K | 300K |
| 40 | 60/100 | 4608 | 17 | 8.6 M | 496 K | 992 K | 1000 K | 1000 K | 500K |

Flow Update Rates

FIG. 15

| | Number of NSearch operations | Number of NRead operations | Number of NWrite operations | Number of DWrite operations | Number of DRead operations |
|---|---|---|---|---|---|
| GLookUp | 1 | 0 | 1 | 1 | 1 |
| GInsert | 1 (best case) m*+1 (worst case) | 1 (best case) m* (worst case) | 1 | 1 | 1 (best case) m* (worst case) |
| GDelete | 1 (secondary) m*+1 (primary) | 0 | 1 | 0 (secondary) m* (primary) | 1 (secondary) m*+1 (primary) |

*m: Number of data aggregation schemes supported by the system

Number of Level 1 Operations per Level 2 Function

FIG. 16

| | Millions of NSearch operations/s | Millions of NRead operations/s | Millions of NWrite operations/s | Millions of DWrite operations/s | Millions of DRead operations/s |
|---|---|---|---|---|---|
| GLookUp | 60 | 0 | 60 | 60 | 60 |
| GInsert | 0.5 (best case)<br>4.5 (worst case)<br>3 (average) | 0.5 (best case)<br>4 (worst case)<br>2 (average) | 0.5 | 0.5 | 0.5 (best case)<br>4.5 (worst case)<br>3 (average) |
| GDelete | 0.05 (secondary)<br>0.5*9=4.5 (primary)<br>3 (average) | 0 | 0.5 | 0 (secondary)<br>0.5*8=4(primary)<br>3 (average) | 0.05 (secondary)<br>0.5*9 = 4.5 (primary)<br>3 (average) |
| Total | 66 | 2 | 61 | 63.5 | 66 |

Number of Level 1 Operations For 40 Gbps Line Rate

FIG. 17

METHOD AND DEVICE FOR VIRTUALIZATION OF MULTIPLE DATA SETS ON SAME ASSOCIATIVE MEMORY

TECHNICAL FIELD

The present invention relates generally to associative memories, such as content addressable memory (CAM) devices, and more particularly to methods and devices for projecting multiple data sets onto the same set of associative memory entries.

BACKGROUND OF THE INVENTION

As is well known, data networks can enable the flow of data packets between network source(s) and destination(s). Such applications can include packet forwarding applications, such as the generation of a "next hop" address as a data packet propagates through a network. Further, to provide additional services, increase performance, and manage growth, it can be desirable to acquire data regarding network use. As but one example, it can be desirable to measure network flow data.

Network flow measurement typically includes aggregating particular data values related to each network flow. This collected data can then be used for various applications, including but not limited to, billing, traffic management, and other types of network analysis techniques. A number of network flow measurement techniques are known. Three particular naming conventions are "NetFlow" provided by Cisco Systems, of San Jose, Calif., "J-Flow" provided by Juniper Networks, of Sunnyvale, Calif., and "sFlow" provided by Foundry Networks, Inc., of San Jose, Calif.

To better understand features and advantages of the disclosed embodiments, examples of conventional network data aggregation will now be described. FIG. 23 shows an example of a table containing data for network flows, as well as associated data for such flows. FIG. 23 is a diagram depicting a "Primary Table" for storing flow information, and represents one very particular approach in which five fields are utilized to define a network flow: a Source IP Address, a Destination IP Address, a Protocol Type, a Source Port, and a Destination Port. In such an arrangement, these fields can be collectively considered a "flow descriptor". As is well understood, such fields can exist in a network packet header transmitted according to a given protocol (e.g., TCP/IP). The associated data of FIG. 23 shows two fields: Number of Packets and Bytes.

Of course, FIG. 23 represents but one example of representing one particular flow type. Packets transmitted according to different protocols would have different header information. For example, NetFlow noted above utilizes seven fields to define a flow.

Referring still to FIG. 23, in a conventional data aggregation approach, an incoming packet header can be parsed for the network flow descriptor fields (in this example, five fields). If these fields of the packet are unique (i.e., not yet included as an entry in the Primary Table), a new entry is created for the flow, with appropriate Associated Data. For example, a "Number of Packets" can be set to 1, and the "Bytes" can be the number of bytes in the received packet. If the flow descriptor fields of a received packet are not unique, the data associated with the flow can be updated according to the received packet (i.e., number of packets and bytes is incremented according to the new packet).

The amount of data produced by flow identification can be very large, due to the granularity with which flows are typically defined (number of fields for flow descriptor). That is, the larger the number of fields used to define flows, the more granularity in the flow data. High granularity data can create a data explosion in network statistics that can be difficult to manage and analyze.

Granularity of accumulated flow data is typically defined by network equipment provided by a vendor. In many cases, the granularity provided by a vendor can be higher than necessary for a given application. That is, a given application may need to collect statistics on a smaller number of fields (e.g., two fields) than the granularity provided by the network equipment. In such applications, collected network flow data can be aggregated based on the smaller number of fields.

Network flow data aggregation can address the large amounts of data presented by high granularity flow data. By aggregating data based on a smaller number of fields, concise flow data can be gathered that is easier to interpret and transfer over a network. For example, Cisco NetFlow (Version 8) supports eleven aggregation schemes for addressing data explosion by making the amount of flow data more tractable.

The number of flows in a network at a given instant can be a very large number that varies as newer flows are added and older flows are deleted. Thus, entries of a Primary Table, like that of FIG. 23, can be continuously aged (deleted, expired) at an average flow rate in order to free up space for new flows. Aging of Primary Table entries can be based on various criteria. A few rules for aging according to NetFlow include (1) expiring idle flows (flows that have been idle for a specified amount of time are expired and removed from the primary table); (2) expiring long lived flows (e.g., as a default, flows in existence for 30 minutes can be expired); (3) expiring flows as the Primary Table fills up (as the Primary Table fills up, a number of heuristics can be applied to aggressively age groups of flows simultaneously); (4) expiring flows based on flag detection (flows can be expired based on predetermined flags/indications within a packet (e.g., for TCP end of byte stream flag (FIN) or reset flag (RST)).

In conventional arrangements, there can be two possible outcomes for Primary Table entry that is aged. These operations are shown in FIG. 24. FIG. 24 is a diagram that shows Primary Table 2400 of FIG. 23, which includes flow-defining entries 2402-1 to 2402-4. In FIG. 24, it is assumed that the first entry 2402-1 is aged (expired from the Primary Table).

A first outcome can occur if the network equipment does not support data aggregation. In this case, the associated data for the aged flow can be sent to a flow collector device 2404.

However, if data aggregation is supported, associated data for the expired entry can be added one or more Secondary Tables (or aggregation tables). The example of FIG. 24 shows two aggregation schemes, resulting in two Secondary Tables 2406-0 and 2406-1. In particular, Secondary Table #1 2406-0 aggregates flow data based on Source IP Address and Destination IP Address, while Secondary Table #2 2406-1 aggregates flow data based on Source IP Address and Source Port.

In such an arrangement, as a Primary Table entry is expired, the Source IP Address and Destination IP Address are checked against corresponding fields in Secondary Table #1 2406-0. If the Source IP Address/Destination IP Address combination is unique, a new entry is added to Secondary Table #1 2406-0. If the combination already exists, the associated data for the Secondary Table #1 2406-0 can be updated. In the same general fashion, a Source IP Address and Source Port Address can be checked against corresponding fields in Secondary Table #2 2406-1 and either a new entry added or the table updated.

A number of conventional approaches to aggregating data are known.

One approach for aggregating data utilizes "hashing". One example of a hashing approach is shown in FIG. 25, and designated by the general reference character 2500. In a hashing arrangement, a Primary Table can be stored in RAM 2502. When an entry is expired, the fields of the entry corresponding to an aggregation scheme can be applied to a hash function to arrive at an address at which to store aggregation data. More particularly, network flow data can be stored in a random access memory (RAM), and hashing can be used to differentiate between primary table and aggregate table entries. In the particular example shown, a hashing function can be executed by hashing logic 2504 formed in an application specific integrated circuit (ASIC) 2506.

A drawback to conventional hashing approaches can be the amount of memory space needed to accommodate the different data tables. That is, a single entry is needed for each value of the different tables.

Another drawback to conventional hashing approaches can be "collisions". As is well known, hashing functions can map a larger address space (i.e., that represented by all possible key combinations) into a smaller address space (i.e., that of the RAM). However, hashing functions are rarely perfect and thus give rise to collisions in which two keys hash to the same location. In such a case, the colliding key must be re-checked with each colliding entry to complete a search. Due the variations in key values, collisions can be an inevitable problem with hashing solutions, and is anticipated to become an even more critical problem as data aggregation is performed at faster line rates (bit transmission speeds).

The above collision problem also gives rise to non-deterministic search times. That is, while a non-colliding search may take one memory access, a colliding search may make multiple memory accesses. It is believed such varying search times will also be more difficult to handle as line rates increase.

Another drawback to hashing solutions can be the data dependence inherent in hashing functions. In particular, a hashing function will give a different collision profile depending upon the input data set. That is, a hashing function operating on a randomly generated data set may have a different collision profile than one operating on actual network data. Because of this, for optimal performance, a hash function polynomial is optimally selected based on a known entry format and expected distribution. However, such approaches remain imperfect.

Related to the above hashing function mapping problems is "funneling". Funneling is a flaw in some hashing functions that can arise when input values vary by only a small amount (i.e., differ by only a few bits). In such cases, variability based on input bit values can be lost. This can lead to entries that vary by only a few bits hashing to the same value, thus giving rise to a large number of collisions.

A second conventional approach is shown in FIG. 26 and designated by the general reference character 2600. A conventional arrangement 2600 can include a CAM portion 2602 and a dynamic RAM (DRAM) portion 2604. In the conventional example of FIG. 26, key portions of both a Primary Table (containing network flow entries) and Secondary Tables (containing aggregate data entries) can be stored in one or more CAM sections 2602. Associated data for each CAM entry can be stored in DRAM portion 2604. In a search operation, a matching CAM entry will generate an index value for accessing the RAM entry containing the associated data.

A conventional approach like that of FIG. 26 can offer considerable advantages in terms of speed and use over hashing approaches. Utilization of CAMs can result in search times that are deterministic and very fast, due to the high speed at which CAM devices can compare key values.

However, a conventional approach like that of FIG. 26 is not without drawbacks. While CAMs provide advantageously fast search speeds, the cost per bit for a CAM device can be considerably higher than that of a DRAM or static RAM (SRAM). As would be understood from FIG. 26, if the number of secondary tables is high, the cost would increase correspondingly.

To better understand various features of the disclosed embodiments, a comparison with respect to the memory requirements of the conventional approaches noted above will be discussed in more detail. Due to the absence of predictability in the behavior of certain networks, and to ensure optimal performance, each secondary table would generally have to be at least equal in size to the primary table. This is because each entry of a primary table could potentially aggregate to a unique entry in a secondary table. Accordingly, if a networking device has a primary table of size "N" entries and has "m" aggregation schemes, the memory space needed would be N*(m+1). It is noted that in a hashing arrangement like that of FIG. 25, while a RAM could include N*(m+1) entries for storing data table values, in order to minimize collisions, a memory space allocated for the entries is typically at least 2× or 4× the number of anticipated data values. Thus, an actual implementation could require an overall storage space size of 4*N*(m+1), with "m+1" being representing the primary table and "m" aggregation schemes.

In the case of a CAM/RAM approach like that of FIG. 26, a system would need both N*(m+1) CAM entries, as well as N*(m+1) DRAM entries.

In light of the above, it would be desirable to arrive at some way aggregating network flow data that does not require as much CAM memory as conventional approaches like those described above. However, at the same time, such a solution should not suffer from the non-deterministic behavior that can arise from approaches utilizing hashing functions.

In the case of packet forwarding, previously forwarding functions could be based on a single criterion: the destination address of a data packet. However, presently more sophisticated forwarding approaches are needed and/or anticipated. That is, it is desirable to forward data packets based on multiple criteria.

As but one very particular example, it is desirable to accommodate varying levels of service for data packets based on one or more identifying features, e.g., different "quality of service" (QOS) or "type of service" (TOS). Conventionally, approaches to such require very large lookup data bases, increasing components size and hence system cost. In particular, a conventional approach can include multiple entries (e.g. CAM storage locations) for each destination/service combination.

In light of the above, it would be desirable to arrive at some way of reducing the number of system components needed in forwarding operations based on multiple criteria.

Still further, all of the above illustrates how there is a general need to arrive at some way of reducing the storage space needed for associative memory (e.g., CAM) applications, particularly those embodying multiple data sets.

SUMMARY OF THE INVENTION

The present invention can include a method of providing multiple data sets for search on a single set of storage entries. The method can include storing at least one data value of a first data set in one physical entry of a plurality of globally maskable content addressable memory (CAM) entries and storing at least a second data value of a second data set, different form the first data set, in the one physical entry. The method can also include distinguishing between the first and second data value by applying a predetermined global mask to the one globally maskable CAM entry.

In such an arrangement a single CAM entry can serve to store data values for two or more data sets. That is, one set of CAM entries will virtually include multiple data sets. This can reduce the number of entries needed to represent such multiple sets with respect to conventional arrangements that provide a different set of CAM entries for each data set.

According to another aspect of the embodiments, the method can further include storing associated data for each data value of the first data set in a first memory section starting a first offset location and storing associated data for each data value of the second data set in a second memory section having different addresses than the first memory section, the second memory section starting a second offset location.

In such an arrangement one CAM entry can point to two different associated data sections.

According to another aspect of the embodiments, a first data set can include a network flow primary table and a second data set can comprise at least one aggregation scheme. A step of storing at least one data value of a first data set can include storing network flow information in corresponding physical CAM entries to form network flow entries of the primary table. A step of storing a second data value can include using an existing primary network flow entry as an aggregation entry that corresponds to the at least one aggregation scheme. The method can further include storing associated data for each flow entry in a first associated data area and storing associated data for each aggregation scheme in a different associated data area.

By utilizing existing network flow entries as aggregation entries, secondary (e.g., aggregation) table entries can be "superimposed" onto a primary table. This can eliminate the need to provide CAM entries for all aggregation schemes, and reduce the CAM requirements of a system to a single primary table.

According to another aspect of the embodiments, storing network flow information can further include setting a primary table valid bit for each network flow entry.

Such an arrangement can distinguish between primary and aggregation entries with valid bits.

According to another aspect of the embodiments, a primary table can have primary table entries that each include "k" data fields, where k is an integer greater than 1. Each aggregation scheme can include a subset "p" of the k data fields, where p<k. Distinguishing between the primary and secondary table values can include searching while applying a scheme global mask value that masks all but the p data fields of the k data fields to search the aggregation scheme, and searching without the scheme global mask value to search the primary table.

In this arrangement, an aggregation scheme can be projected onto network flow entries.

According to another aspect of the embodiments, storing network flow information can include receiving new network flow information, and searching for an existing aggregation scheme entry having a subset of fields that match the new network flow information fields. Assuming an aggregation scheme entry is found, if writing the new network flow information would not alter a field value combination utilized by the existing aggregation scheme entry, the method can include storing the new network flow information in the matching CAM entry. However, if writing the new network flow information would alter the field value combination utilized by the existing aggregation scheme entry, the method can include storing the new network flow information in an unused CAM entry, if an unused CAM entry is available.

In this way, a compact primary table can be maintained as new entries may be written into existing aggregate entries, and will only require an unused entry if such an operation is not possible. According to another aspect of the embodiments, the method can include receiving a delete command to delete an existing primary table entry and aggregate the data of the primary table entry. In response to the delete command, the method can include, for each of a plurality of aggregation schemes, searching for an existing aggregation entry having a subset of fields that match corresponding fields of the primary table entry. If an existing aggregation entry cannot be found that has the subset of fields that match corresponding fields of the primary table entry, converting said network flow entry into an aggregation scheme entry. In this way, a compact primary table can be maintained, as a new aggregate entry can be created for only those aggregation schemes not yet in existence by using a network flow entry.

According to another aspect of the embodiments, flow entries can be distinguished from aggregation entries according to valid bits in each entry. In one very particular case, valid bits can include at least one unique bit location corresponding to a primary table (for flow entries), and at least one bit location unique to each aggregation scheme.

Such an arrangement can provide a dependable and compact way of "superimposing" primary and aggregate entries in the same set of CAM entries.

According to another aspect of the embodiments, the method can include accessing associated data for each aggregation entry by generating an offset address according to a scheme value, and adding the offset address to an index value that corresponds to a matching aggregation entry.

In this way, associated data for both the primary and aggregate tables can accessed with a single CAM entry table.

According to another aspect of the embodiments, a first data set can include a first type service designation for a data packet and second data set can include a second type service designation for a data packet. In addition, the step of applying the predetermined global mask includes masking all but a desired service type designation to generate packet forwarding data corresponding to the desired service type.

According to another aspect of the embodiments, each CAM entry can include a predetermined number of service type bit locations, each bit location corresponding to a different service type designation. Each service type bit location can have a set state and not set state.

According to another aspect of the embodiments, a step of storing at least one data value can include setting a predetermined service type bit for a plurality of entries to a set state to establish a default service value for the data values of the entries.

According to another aspect of the embodiments, a step of storing at least one data value can further include storing a priority forwarding value having the same plurality of matching field values as the default forwarding value, the priority forwarding entry having less than all service type bits with set states and a higher priority physical address location.

According to another aspect of the embodiments, each CAM entry further includes at least a destination field that indicates the destination of a data packet.

According to another aspect of the embodiments, the method can further include receiving a delete command to delete an existing first data set entry. A delete command can indicate matching field values and at least one service type. In response to a delete command, the method can include finding each first data set entry having fields that match the fields of the delete command. If the service type designations of the entry do not match all the fields of at least one service type of the delete command, setting the matching service type designations to a non-set state. If all of the service type designations of the entry match at least one service type of the delete command, deleting the entry.

According to another aspect of the embodiments, the method can include receiving a write command indicating matching field values and at least one service type. The method can also include, in response to the write command, finding an entry having fields that match the matching fields of the write command. If the service type designations of the entry do not match the service type of the write command, setting the matching service type designation of the entry to a non-set state.

The present invention can also include a method for providing multiple data set values with a single set of globally maskable content addressable memory (CAM) entries. The method can include storing first data set values in the CAM entries, each data set value comprising a plurality of unique fields. In addition, the method can include utilizing a CAM entry that stores a first data set value to simultaneously store a proxy value for at least one other data set. Each proxy value can represent a data set value that shares a subset of the unique fields of the first data set values.

According to one aspect of the embodiments, the method can include storing associated data for each first data set value in a first random access memory (RAM) section accessed with a first table offset address value. In addition, the method can include storing associated data for other data set in a corresponding other RAM section accessed with other offset address values unique to each other data set.

According to one aspect of the embodiments, a method can include one type of read function. Such a read function can include reading RAM data according to the primary table address offset values and an index value generated by searching the primary table CAM entries. According to one aspect of the embodiments, a method can include another type of read function. Such a function can include reading RAM data according to one of the aggregate address offset values and an index value generated by searching proxy entries for an aggregation scheme.

Such an arrangement can enable rapid access of primary table associated data, and can be useful in operations such as flow updating in response to new packet data. Such a function can enable rapid access of aggregate table associated data. Further, such a function can be useful when updating aggregation data in response to the expiration of a flow entry. According to one aspect of the embodiments, the method can include, in one type of data modify operation, modifying data read from a RAM location accessed by one of the address offset values and an index value according to data from a newly arrived data packet. According to another aspect of the embodiments, a method can include in another type of data modify operation, modifying data read from a RAM location accessed by one of the aggregate address offset values according to data read from a RAM location accessed by the primary table address offset value.

Such a feature can enable rapid modification of primary table associated data. This function can be useful when updating primary table associated data in response to new packet information. Such features can enable rapid modification of aggregate associated data. This can be useful when updating aggregate associated data in response to a deleted primary table entry.

The present invention can also include a system for searching multiple data set values with a single content addressable memory (CAM) table. The system can include a CAM section having N globally maskable CAM entries, each CAM entry operable to store N data set values that index to first set associated data, at least one second set associated data, or both first and second set associated data. The system can also include a control section having an address generator that generates offset addresses corresponding to a predetermined global mask value. Offset addresses can include a first data set offset address and a plurality of secondary set offset addresses each corresponding to a different set of associated data.

According to another aspect of the embodiments, an associated data section can include a first section having no more than N entries that store first set associated data, and at least a second section having no more than N entries for storing second set associated data.

According to another aspect of the embodiments, a control section can be an application specific integrated circuit formed on a different integrated circuit than the CAM section, a programmable logic device formed on a different integrated circuit than the CAM section, or a processor executing instructions.

Such an arrangement can allow a system to be formed with an "off the shelf" CAM device in conjunction with other circuit components.

According to another aspect of the embodiments, a control section can be formed in the same integrated circuit as the CAM section.

According to another aspect of the embodiments, each CAM entry can include a plurality of valid bits. A CAM section can include a global mask register that generates global masks for searching the CAM entries, the global mask register including a global mask corresponding to each valid bit.

Such an arrangement can provide for a fast, reliable way of distinguishing between entries corresponding to different data sets.

According to another aspect of the embodiments, each CAM entry can include valid bits, each valid bit corresponding to one of a plurality of schemes. The schemes can include a primary table and each of the aggregation schemes. In addition, the CAM section can include global mask registers that generate global masks for searching the CAM entries. The global mask registers can include a global mask corresponding to each scheme that masks all valid bits except the valid bit of the corresponding scheme.

Such an arrangement can provide for a fast, reliable way of distinguishing between entries corresponding to a primary table, and entries corresponding to aggregate tables.

According to another aspect of the embodiments, a control section can further include an input parsing section that adds valid bits to a received search key data to generate an internal search key applied to the CAM registers According to another aspect of the embodiments, a control section can further include an address modifier that generates a new address based on an offset address from the address generator and an index value from the CAM section.

According to another aspect of the embodiments, the data set values that index to the first set associated data and both the first and second set associated data comprises a primary table, where each data set value defines a network flow. In addition, data set values that index to the second set of associated data and both the first and second set associated data comprises an aggregation table, where each data set value defines a network flow data aggregation scheme.

According to another aspect of the embodiments, data set values that index to the first set associated data can include forwarding information for a first type of packet transmission service. In addition, data set values that index to the second set of associated data can comprise forwarding information for a second type of packet transmission service.

BRIEF DESCRIPTION OF THE DRAWINGS

FIGS. 3A and 3B are block diagrams showing the operation of the embodiment set forth in FIG. 2.

FIG. 6A is a diagram showing a sample format of a key received by the embodiment of FIG. 5. FIG. 6B is a diagram showing a sample format for an internal search generated by the embodiment of FIG. 5. FIG. 6C is a diagram showing a sample format for a global mask generated by the embodiment of FIG. 5.

FIGS. 12A and 12B show a flow diagram of an entry insertion function according to one embodiment.

FIG. 15 is a table illustrating look-up rate requirements for data aggregation based on different line speeds.

FIG. 16 is a table illustrating the number of first level (device) functions needed for each second level (routine) function according to an embodiment of the present invention.

FIG. 17 is a table illustrating how the second level functions can meet the search and data access rates needed for higher line speeds.

DETAILED DESCRIPTION

Various embodiments of the present invention will now be described in detail with reference to a number of drawings. The embodiments include a system and method that utilizes a ternary content addressable memory (TCAM) having a global masking capability to manage multiple data tables with less TCAM resources than conventional approaches.

It is understood that data "table" or data "set" as described herein, can include sets of multiple data values, where each data value is composed of multiple data fields. Data values having the same data fields can be considered to be included in the same data set. According to the embodiments described, two or more data sets can be formed in the same set of physical TCAM entries by utilizing one physical entry to represent a data value in two different sets. A physical entry can be the actual physical circuitry on a TCAM device for storing a data value (or in this case multiple data values of different sets) to thereby form an entry. Each such physical entry can be accessed according to a physical address.

In this way, one set of TCAM entries can "virtually" represent multiple data sets, but not have to include one physical entry for each value of each different data set. In the embodiments described, a global maskable TCAM can have entries with search fields (keys) corresponding to multiple data tables. Differentiation between data sets can be accomplished according to global masking of data fields. Optionally, each entry can include table identifier bits to further identify those entries belonging to multiple data sets.

System and Device—Generally

Figure 1A:
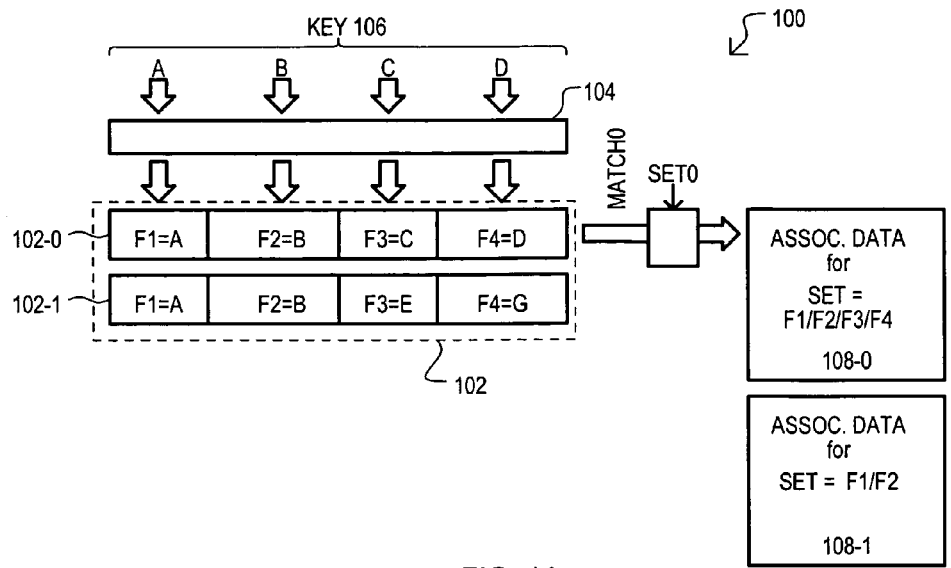
FIGS. 1A and 1B show is a block diagram of a first embodiment of the present invention.
Figure 1B:
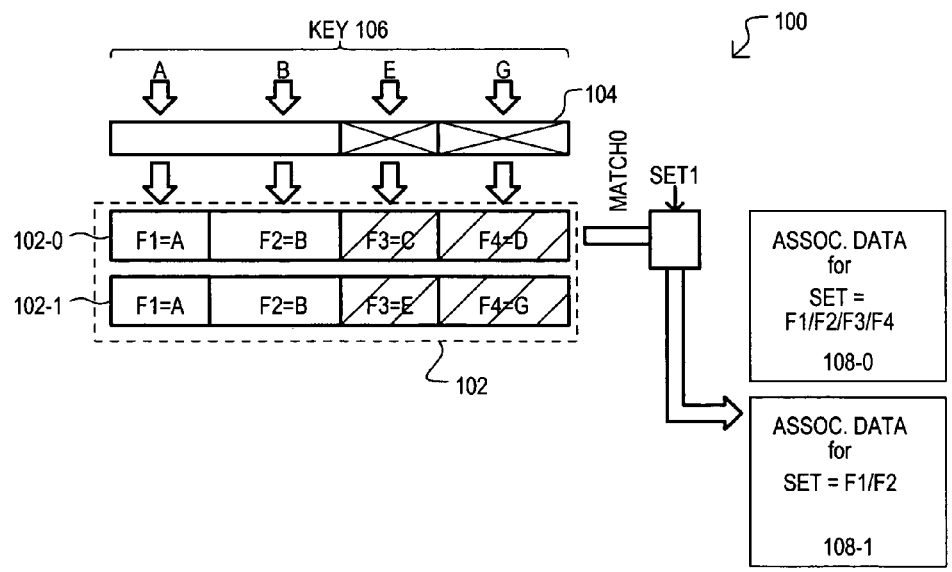

FIGS. 1A and 1B show a method and system according to a first embodiment. A first embodiment 100 can include a number of globally maskable CAM entries 102. It is understood that these CAM entries 102 are physical entries of a CAM device. CAM entries 102 are represented in FIGS. 1A and 1B by entries 102-0 and 102-1, but it is understood that CAM entries 102 can include numerous such entries, all of which can be compared to a search key essentially simultaneously.

CAM entries 102 are "globally" maskable according to a global mask 104. A global mask 104 can all mask entries 102 from a compare (e.g., search) operation by bit location, or multiple bit locations. This is in contrast to conventional ternary masking, which enables bit-by-bit masking on a per entry basis.

In such an arrangement, selective global masks can be used generate multiple match indications from a single entry, with each different match indication corresponding to a different data set.

CAM entries (102-0 and 102-1) can each store a data value composed of multiple fields. In the example of FIGS. 1A and 1B, each CAM entry (102-0 and 102-1) stores four field values F1, F2, F3 and F4. While CAM entries 102-0 and 102-1 have common values for fields F1 and F2 (A and B, respectively), CAM entry 102-0 differs from CAM entry 102-1 in fields F3 and F4.

The particular example of FIGS. 1A and 1B shows the virtualization of two data sets in the same set of CAM entries. A first data set includes values having fields F1/F2/F3/F4. A second data set includes only fields F1/F2. FIGS. 1A and 1B show how global masking can differentiate between different data set values stored in a same CAM entry.

In FIG. 1A, a key value is applied having values A/B/C/D. According to conventional CAM matching functions, the key value is compared to stored CAM entry values to determine if a match exists. In FIG. 1A, the key values match CAM entry 102-0, and thus generate a match indication MATCH0.

A match indication MATCH0 can be utilized to access associated data corresponding to a first data set. In the particular example of FIG. 1A, match indication MATCH0 is combined with a set value SET0 to access a first associated data section 108-0.

In FIG. 1B, a key value is applied having values A/B/E/G. Ordinarily, such a key value would match CAM entry 102-1. However, in the example shown, global mask 104 masks fields F3 and F4 from a compare operation. As a result, a match occurs in a highest priority CAM entry between 102-0 and 102-1 (assumed in this case to be CAM entry 102-0). Thus, CAM entry 102-0 generates another match indication MATCH0. However, such a match indication MATCH0 can be utilized to access associated data corresponding to a second data set.

In the particular example of FIG. 1B, match indication MATCH0 is combined with a set value SET1 to access a second associated data section 108-1.

It is understood that fields (e.g., F1 to F4) can be of arbitrary bit size. That is such fields can represent multi-bit criteria (e.g., network flow descriptor data) or single bit criteria (e.g., valid bit data), or some combination thereof.

In this way, a single instance of a globally maskable CAM array can virtually present multiple data sets for search.

System and Device—Data Aggregation

In the embodiments described, a global maskable TCAM can have physical entries with search fields (keys) corresponding to multiple data tables. Differentiation between data sets can be accomplished according to global masking of data fields. Optionally, each entry can include table identifier bits to further identify those entries belonging to multiple data sets. Associated data for both primary and secondary tables can be stored in a different type of memory (e.g., DRAM or SRAM), preferably one having a lower cost per bit.

Figure 2:
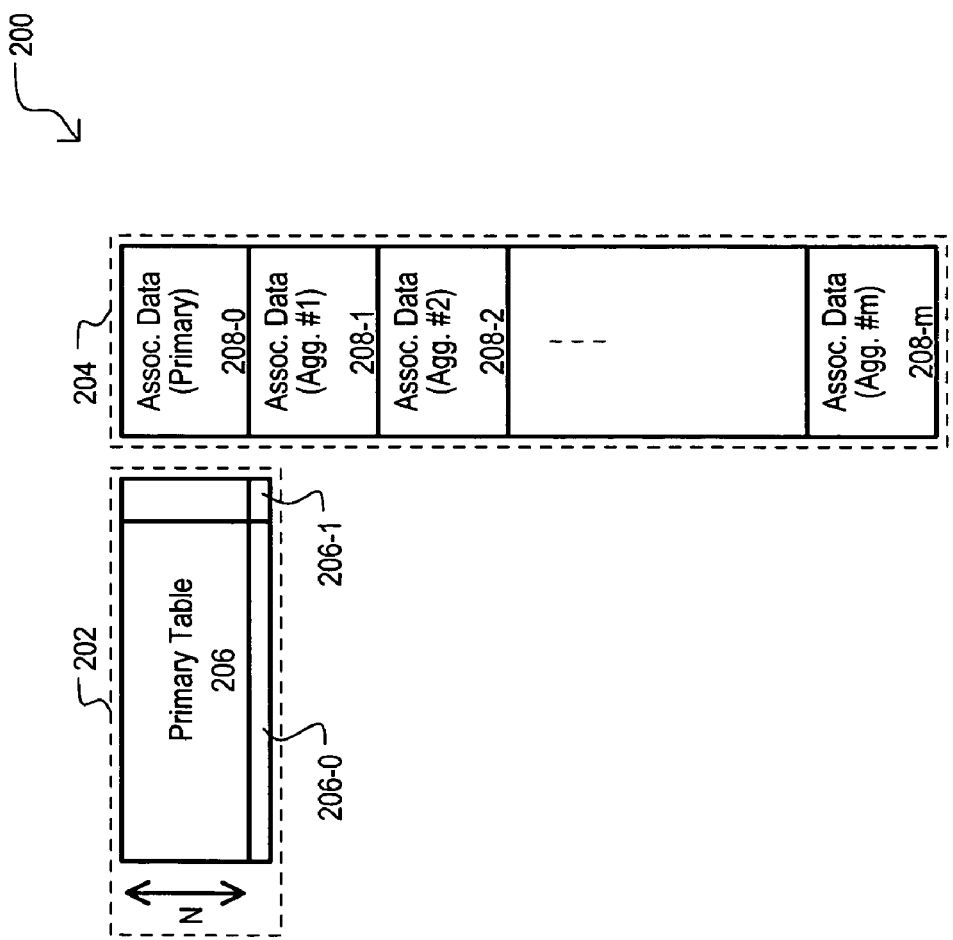
FIG. 2 is a block diagram of a second embodiment of the present invention.

A system for providing data aggregation according to another embodiment is set forth in a block diagram in FIG. 2, and designated by the general reference character 200. A system 200 can include a CAM portion 202 and an associated data portion 204. A CAM portion 202 can be formed from entries of one more CAM devices having a global masking capability.

As but one example, the Ayama 10000 Network Search Engine, manufactured by Cypress Semiconductor Corporation, of San Jose, Calif. includes 16 pairs of global mask registers, each pair being 144-bits wide.

Each entry of CAM portion 202 can store key searchable data for a primary table. In this case, such data can be the data of relevant flow descriptor fields. By use of global masking and aggregation defining bit values, such entries can also serve as key data for one or more secondary tables, or as keys for both primary and secondary tables. Thus, a CAM portion 202 can be conceptualized as including a single set of physical CAM entries that store multiple data sets, with at least one physical entry storing different data values of different data sets.

Figure 26:
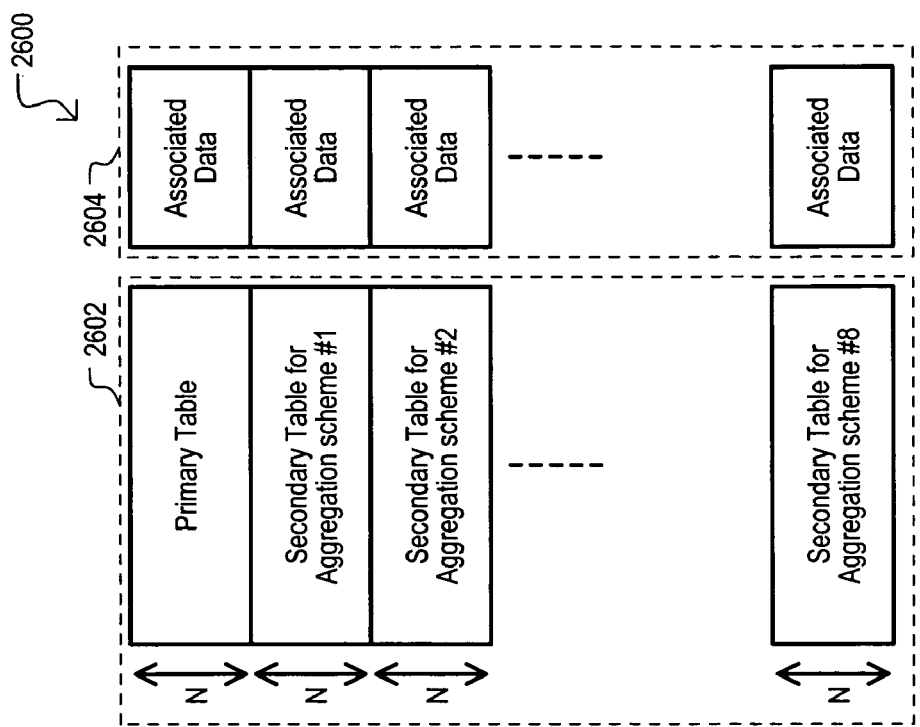
FIG. 26 is a block diagram showing a second conventional system for aggregating data.
Figure 25:
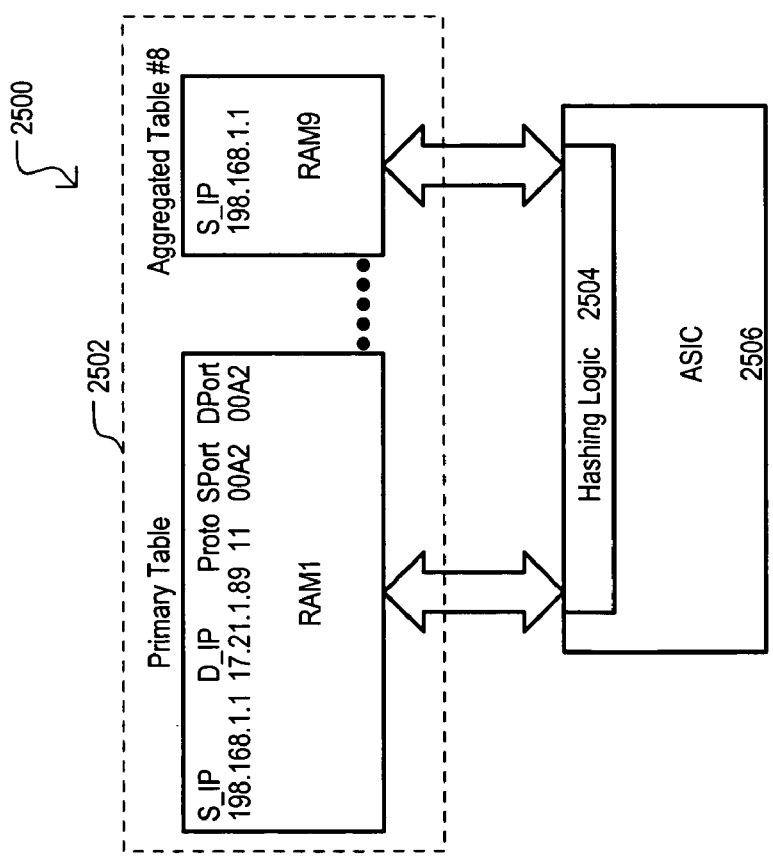
FIG. 25 is a block diagram showing a first conventional system for aggregating data that utilizes hashing.

As a result, unlike the conventional arrangement of FIG. 26, a system 200 can include one table (primary table 206) for key data in CAM portion 202, instead of multiple tables (primary and secondary tables). Accordingly, for a system providing "m" data aggregation schemes, a first embodiment 200 can provide about a 1/(m+1) reduction in needed CAM entries, as compared to the conventional approach of FIG. 26.

Entries of primary table 206 can include key portions 206-0 that can define unique primary data values. In addition, and unlike conventional approaches, each entry can also include a table identifier portion 206-1. A table identifier portion 206-1 can indicate if a CAM entry corresponds to a primary table or to any of the multiple secondary tables.

An associated data portion 204 can store associated data for both primary and secondary tables. Thus, in the example of FIG. 2, associated data portion 204 can include primary data area 208-0 for storing associated data corresponding to a primary table (e.g., data associated with individual flows), and aggregate data areas 208-1 to 208-$m$, for storing associated data corresponding to "m" secondary tables (e.g., aggregate data).

An associated data portion 204 is preferably formed from RAM devices, even more preferably from DRAM, which may provide an advantageously low cost per bit.

In this way a system 200 can provide high look-up rates (CAM speed) to associated data in a primary table and multiple secondary tables totaling (m+1)*N RAM entries, with only about N CAM entries.

Referring now to FIGS. 3A and 3B, two block diagrams are shown representing how primary and aggregate data can be accessed by utilizing global masking within table identifier portion 206-1. FIGS. 3A and 3B show the structure of FIG. 2, and in addition, shows the application of a search key 300 according to a global mask 302.

In FIG. 3A, a global mask 302 is configured as a primary table mask. Thus, in response to a "hit", a modify operation 304-0 can access an entry in primary data area 208-0. A primary table mask can mask out bit values designating secondary tables, and thus identify only those entries representing primary table keys values. In contrast, in FIG. 3B, a global mask 302 is configured as an aggregate table mask. A secondary table mask can mask out a bit value (or bit values) designating a primary table, as well as those for non-relevant secondary tables, and thus identify for search the key values of one secondary table. Thus, in FIG. 3B in response to a "hit", a modify operation 304-1 can access an entry in an aggregate data area 208-i.

In a preferable arrangement of FIG. 3B, a key value 300 is not a key related to an incoming packet, but rather a key generated in response to aggregation related command/instruction.

In this way, the same physical CAM entry can be switched between representing primary data to representing aggregate data by setting one (or possibly more) bits in a table identifier portion 206-1. In addition, searches can apply a global mask that distinguishes between such values.

Figures 4A, 4B:
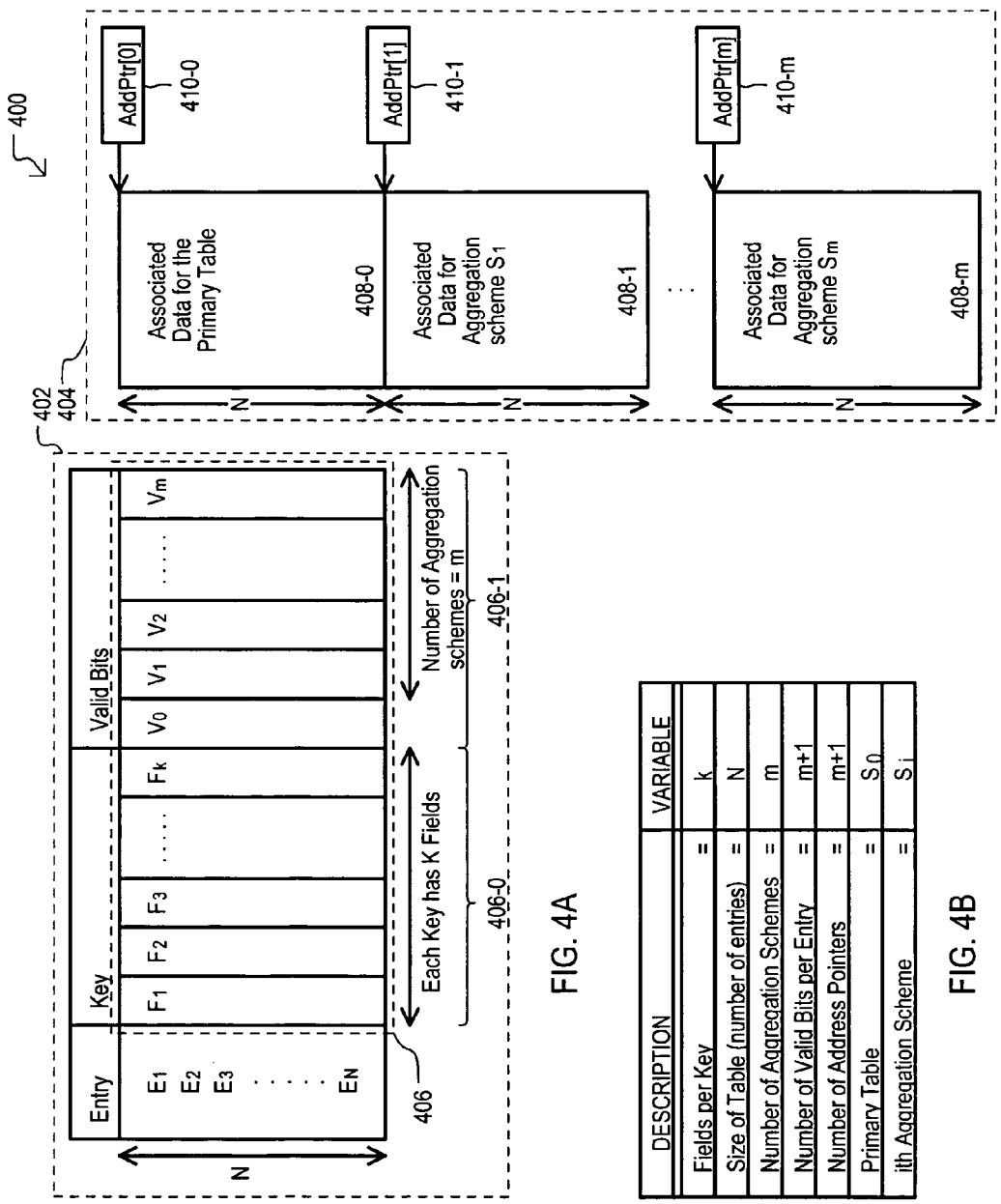
FIG. 4A is a block diagram showing a more detailed embodiment of the present invention.
FIG. 4B is a table showing variables that will be used in the description of the embodiments.

A more detailed embodiment of the present invention is set forth in FIG. 4A, and designated by the general reference character 400. The embodiment of FIG. 4A includes some of the same general items as FIG. 2. Thus, like items will be referred to by the same reference character as FIG. 2, but with the first digit being a "4" instead of a "2".

FIG. 4A shows a CAM portion 402 that includes "N" physical entries ($E_1$ to $E_N$), each having a key portion 406-0 and table ID portion 406-1. In the particular example shown, a key portion 406-0 can store a key formed from "K" fields ($F_1$ to $F_k$) and a table ID portion 406-1 formed from "m"+1 valid bits. Further, of the m+1 valid bits, one valid bit $V_0$ can identify a primary table value, while valid bits $V_1$ to $V_m$ can each identify a different aggregation scheme. Thus, searches directed to a primary table value can use a global mask that masks out valid bits $V_1$ to $V_m$. Conversely, a search directed to a particular aggregation scheme indicated by valid bit "$V_i$" will use a global mask that masks out valid bit $V_0$, and all other valid bits except $V_i$.

Within associated data portion 404, each data area (408-0 to 408-m) can start at an address indicated by an address pointer (represented by items 410-0 and 410-m). In such an arrangement, associated data can be accessed by adding an address pointer value to an index value generated by a CAM portion 402, as will be described in more detail below.

In the very particular example shown, a CAM portion 402 can have "N" entries and each data area (408-0 to 408-m) can have N entries.

The arrangement of FIG. 4A shows a number of variables that will be reused in descriptions below, and so are listed in Table form in FIG. 4B.

Figures 4C, 4D:
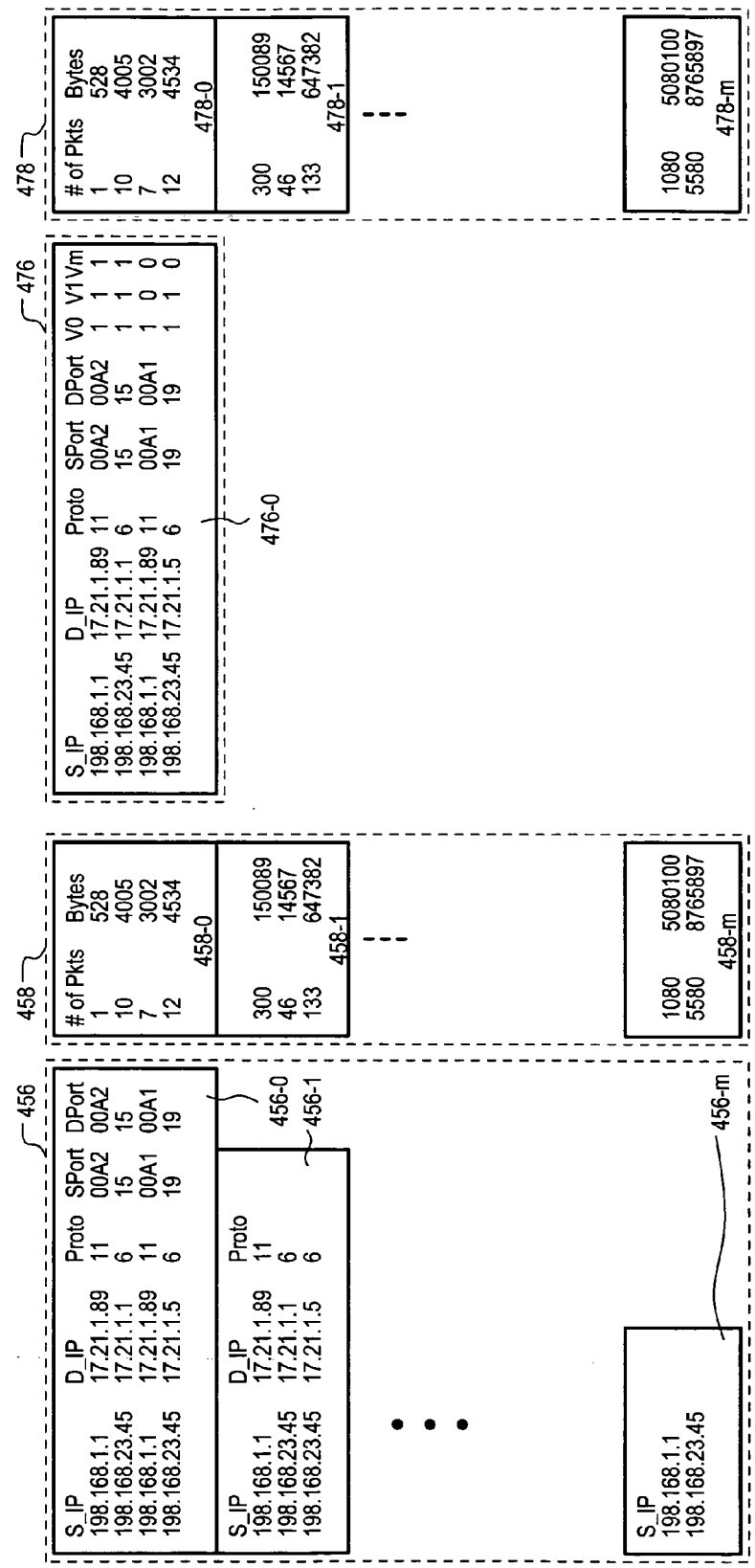
FIG. 4C is a block diagram showing a conventional example of flow data aggregation.
FIG. 4D is a block diagram showing aggregation of the same flow data as FIG. 4C according to an embodiment of the present invention.

To better understand data aggregation according to the present invention, one very particular example showing the aggregation of flows is shown in FIGS. 4C and 4D.

FIG. 4C shows a conventional approach like that shown in FIG. 26 for storing flow values in a CAM section 456 and associated data in a RAM section 458. Thus, CAM section 456 includes a primary table 456-0, along with multiple secondary tables 456-1 to 456-m. In the very particular example of FIG. 4C, primary table 456-0 includes four flows, defined by an IP source address (S_IP), an IP destination address (D_IP), a protocol type (Proto), a Source Port (SPort) and a Destination Port (DPort).

Two of the secondary table aggregation schemes are also shown in FIG. 4C. For secondary table 456-1, data is aggregated based on fields S_IP, D_IP and Proto. For secondary table 456-m, data is aggregated based on the S_IP field.

A RAM section 458 can include associated data 458-0 for the primary table, as well as associated data for secondary tables 458-1 to 458-m. In the very particular example of FIGS. 4C and 4D, associated data can include two fields: number of packets (# of Pkts) and number of bytes (Bytes).

FIG. 4D shows how the data illustrated in the conventional case of FIG. 4C can be more compactly fit into a single CAM table. Thus, FIG. 4D shows only one table 476-0 in CAM section 476 containing the four flow entries. Each defines a current flow, as shown by valid bit "V0" being set to "1". In addition, first, second and fourth entries can be considered "proxy" entries, and these entries can point to associated data section 478-1. This is shown by valid bit "V1" being set to "1" for these entries. Finally, the first and second entries also serves as a proxies for a last associated data section 478-m as shown by valid bit Vm being set to "1" for these entries. Thus, single physical entries store multiple data values (e.g., act as "proxies").

A RAM portion 478 of FIG. 4D can be essentially the same as that of FIG. 4C.

Of course, FIG. 4D represents but one possible application of the present invention.

The above embodiments and examples thus clearly show that, unlike conventional arrangements (like that of FIG. 26) different CAM entries for primary and secondary tables are not needed, reducing the amount of overall CAM required, while at the same time supporting a large number of secondary tables for aggregation data.

Figure 5:
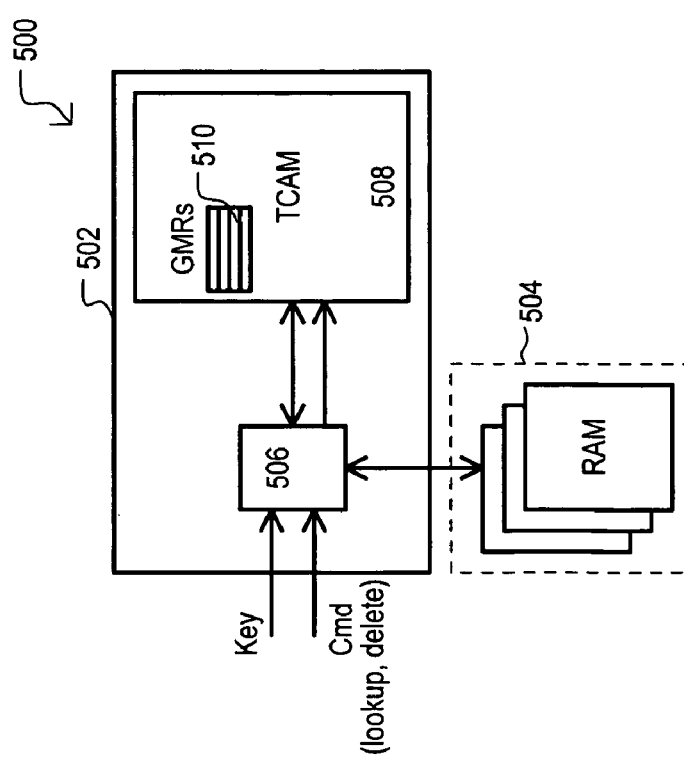
FIG. 5 is a block schematic diagram of a system according to an embodiment of the present invention.
Figure 9A:
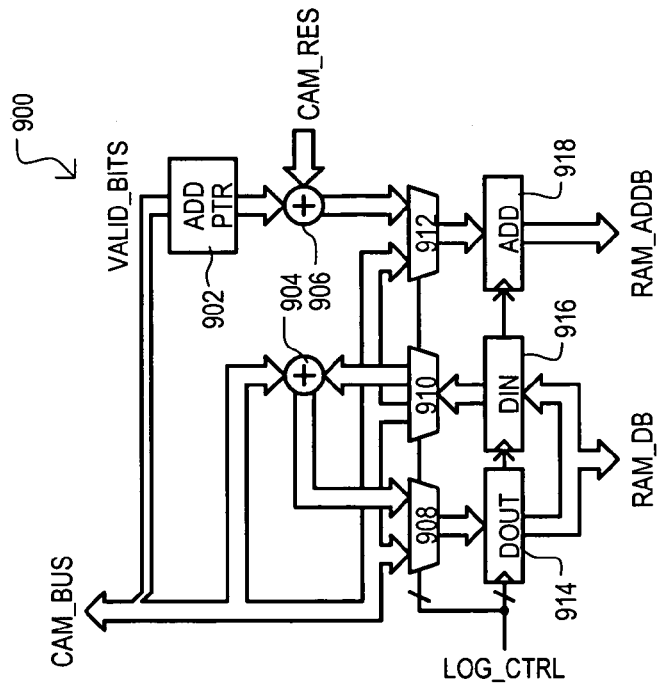
FIG. 9A is a block schematic diagram of a logic section that can be used in the control section shown in FIG. 8.

Another detailed embodiment of the present invention is set forth in FIG. 5, and designated by the general reference character 500. A system 500 can correspond to any of the above-described embodiments. A system 500 can include a search device 502 and one or more RAM devices that form a RAM section 504. A search device 502 can include a control section 506 and a ternary CAM (TCAM) section 508 that provides search and related operations. A CAM section 508 can include maskable CAM entries for executing various CAM related functions, including globally maskable compare operations with applied search key values, as well as writes to and reads from such CAM entries. A CAM section 508 can also include global mask registers 510 for storing global masks, as described above.

A control section 506 can receive key values (Key) and commands values (Cmd). In response to such values, a control section can provide data and control signals (e.g., commands) to both CAM section 508 and RAM section 504. More particularly, a control section 506 can provide a number of device functions detailed below. Such functions can include arithmetic or other operations on received data values. Further, such functions can be executed in predetermined orders to provide higher level routines for use at an application level. This too will be described in more detail below.

A control section 506 may be formed in a separate integrated circuit than a CAM section 508. That is, a control section 506 may be an application specific integrated circuit (ASIC), or may be implemented by programmable logic, such as an FPGA, as but two examples. Still further, a control section 506 can include registers manipulated by a processor according to predetermined instructions.

Alternatively, a control section can be included within the same substrate as a CAM section 508.

A RAM section 504 can preferably be formed from "off the shelf" synchronous dynamic random access memories (SDRAMs). However, alternate memory types could be utilized, including but not limited to other types of DRAMs, static RAM (SRAMs), or other fast access RAMs.

First Level Functions.

The following portions of the description will refer to particular functions related to devices and methods of the present invention. Such functions will be described according to a particular syntax, as detailed below.

The functions include, but are not limited to, a TCAM search (NSearch), a TCAM write (NWrite), a TCAM read (NRead), a RAM write (DWrite), and a RAM read (DRead).

NSearch.

An NSearch(K,i) function can execute a search on CAM entries according to a key value "K" and a scheme value "i". Further, a scheme value "i" can select a particular global mask utilized in the search. An example of such an arrangement is shown in FIGS. 6A to 6C.

FIG. 6A shows a sample key value "K" that includes a number of fields $F_1$ to $F_k$.

FIG. 6B shows one example of how an NSearch(K,i) function can generate a modified key value K' based on key value K and scheme value "i". In particular, a new key value K' can include the key value K along with valid bits $V_0$ to $V_m$. With respect to the valid bits ($V_0$ to $V_m$), the $i^{th}$ valid bit can be set to one value (in this example, 1), while all remaining valid bits are set to another value (in this example, 0). Each valid bit can indicate a particular scheme (e.g., primary table or one of the aggregate data tables). Thus, the setting of the valid bit directs the TCAM search to a particular scheme.

FIG. 6C shows a global mask corresponding to an NSearch(K,i) function. A global mask can be configured prior to a search operation, or generated by a search operation. A global mask can include fields and valid bit locations corresponding to the generated key value K'. As shown, a global mask can include non-masking values (in this case, 1) for the bit locations of the key fields. Further, with respect to the valid bit locations, the $i^{th}$ masking bit can be set to a non-masking value, while all remaining valid bits can be set to masking value (in this example, 0).

In this way, a global mask can indicate one hit value for the indicated scheme, and mask out any other schemes the same CAM entry might correspond to.

An NSearch command will be described herein according to the following syntax:

(hit, index)=NSearch(K,i)

Inputs: K=Search Key; i=scheme ($i^{th}$ global mask in CAM)

Outputs: hit=indicates whether search yielded a hit or miss;

index=location of CAM entry corresponding to search hit.

NWrite.

An NWrite(address,data) function can write data to a CAM location. Data written to a CAM location can be maskable according to a global mask value.

An NWrite command will be described herein according to the following syntax:

NWrite(address,data)

Inputs: address=CAM address where data is to be written; data=data to be written to the CAM location.

NRead.

An NRead(address) function can read data from a CAM location.

An NRead command will be described herein according to the following syntax:

data=NRead(address)

Input: address=CAM address from which data is to be read;

Output: data=data read from the CAM location.

DWrite.

A DWrite(address,data) function can write data to a RAM location.

A DWrite command will be described herein according to the following syntax:

DWrite(address,data)

Inputs: address=RAM address where data is to be written; data=data to be written to the RAM location.

DRead.

A DRead(address) function can read data from a RAM location.

A DRead command will be described herein according to the following syntax:

data=DRead(address)

Input: address=RAM address where data is to be written;

Output: data=data read from the RAM location.

System Component Examples.

Figure 7:
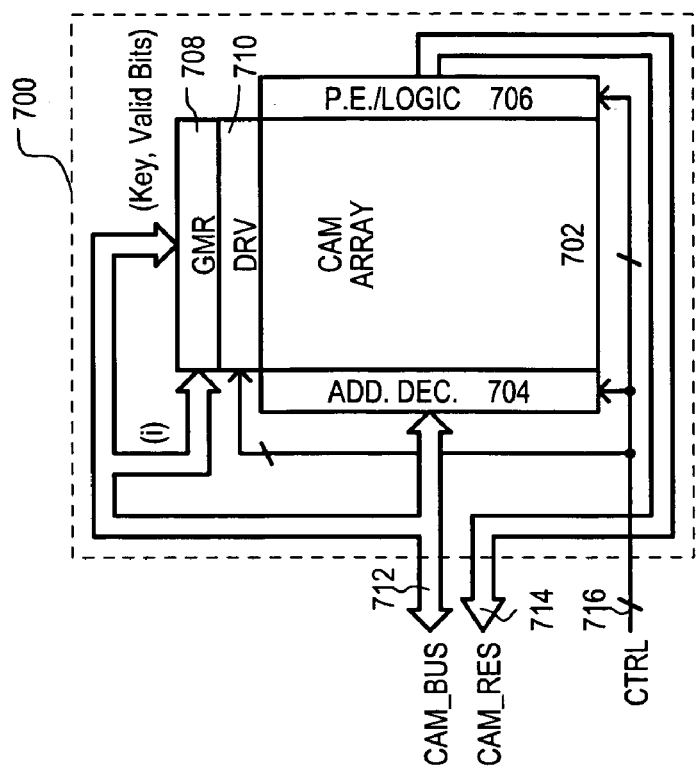
FIG. 7 is a block diagram of a CAM section that can be used in the embodiment of FIG. 4.

Referring now to FIG. 7, a block schematic diagram is shown illustrating one particular example of a CAM section 700 that can be used as a CAM section like that shown as 508 in FIG. 5. A CAM section 700 can include a CAM cell array 702, an address decoder 704, a priority encoder (PE)/logic section 706, a global mask register array 708, and driver circuits 710. A CAM section 700 can also include a CAM data bus (CAM_BUS) 712 and a CAM result bus 714 (CAM_RES). A CAM section 700 can receive control data (e.g., command and clocks) by way of a control input 716.

Having described the general structure of a CAM section 700, the operation of the CAM section 700 during the various functions above will now be described.

In an NSEARCH operation, a global mask value can be selected from global mask register array 708 according to a scheme value "i". A key value along with valid bits can then be applied to CAM cell array 702 according to the selected global mask value by driver circuit 710. A highest priority matching entry can be encoded by PE/logic section 706 to provide an index value, along with other information, such as a HIT indication, or the like. A HIT indication can be a flag or other data value that can indicate whether the search generated a hit, miss, or multiple hits, as but a few examples. An index and hit indication can be output on CAM result bus 714.

In an NWrite and NRead operation, an address value corresponding to a CAM entry can first be placed on CAM data bus 712. Such an address can be decoded in address decoder 704 to select a particular CAM entry. In an NWrite operation, write data can then be placed on bus 712 and written into a CAM entry. In an NRead operation, read data can then be output on bus 712.

Of course, the CAM section 700 of FIG. 7 is but one very particular example of CAM section, and so should not be construed as limiting the invention thereto.

Figure 8:
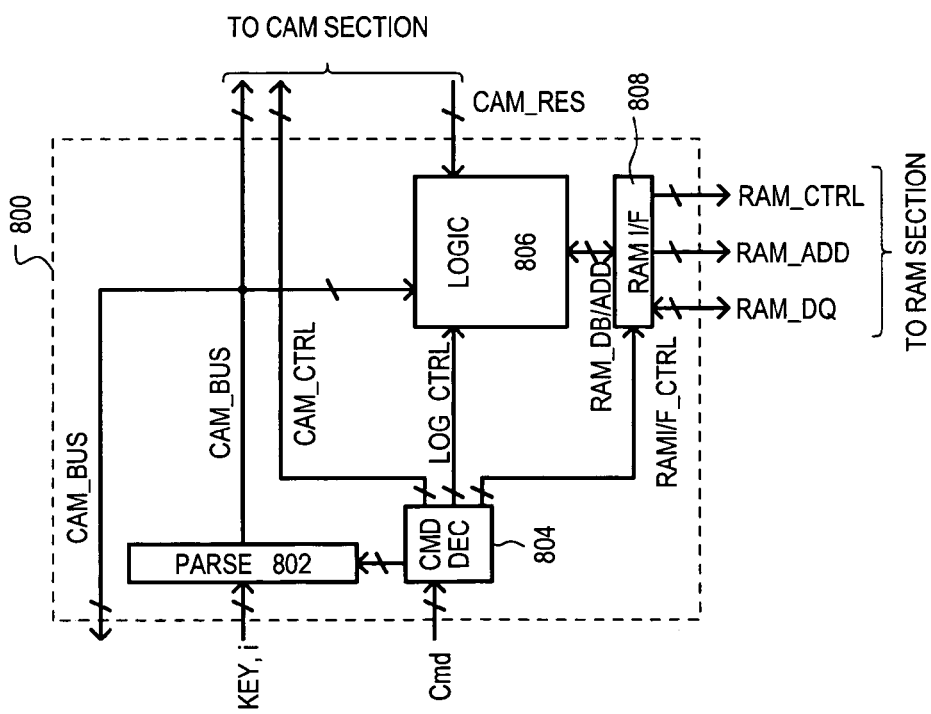
FIG. 8 is a block schematic diagram of a control section that can be used in the embodiment of FIG. 4.

Referring now to FIG. 8, a block schematic diagram is shown illustrating one particular example of a control section 800 that can be used as that shown as 506 in FIG. 5. A control section 800 can include an input parse section 802, a command decoder 804, a logic section 806 and a RAM interface 808. An input parse section 802 can arrange incoming field values to appropriate bit locations for application to a CAM section. In addition, and unlike conventional arrangements, an incoming parse section can generate valid bits (V0 to Vm) for a key value. In one very particular arrangement, such an operation can be accomplished by way of a decoder that decodes a value "i" into a "one-hot" set of valid bits (V0 to Vm). Still further, in the case of erase operations, all valid bits can be set to zero. Of course, such a decoding operation could be executed within a CAM section closer to driver circuits.

A resulting key value from input parse section 802 can be placed onto CAM data bus CAM_BUS.

A command decoder 804 can decode an incoming command (Cmd) to generate CAM control signals (CAM_CTRL) for a CAM section, logic control signals (LOG_CTRL) for logic section 806, and RAM interface control signals (RAMI/F_CTRL) for RAM interface 808. Commands can include, but are by no means limited to, those described above: NSearch, NWrite, NRead, DWrite, and DRead.

A RAM interface 808 can access a RAM section by generating RAM address signals on an address bus (RAM_ADD) and control signals on control lines (RAM_CTRL). RAM data can be output and input by way of bi-directional data bus (RAM_DQ). As but one particular example, a RAM interface 808 can be a synchronous DRAM interface. Of course, the particular interface can vary according to the structure of memory section.

A logic section 806 can receive input data values from a CAM data bus CAM_BUS, a CAM result bus CAM_RES, and a RAM interface 808. In response to logic control signals LOG_CTRL, logic section 806 can provide data paths and operations according to the particular decoded command. These will be described in greater detail below.

Referring now to FIGS. 9A to 9F, a block schematic diagram is shown illustrating a portion of a logic section 900, like that shown as 806 in FIG. 4. Logic section portion 900 can include an address pointer generator 902, adders 904 and 906, multiplexers (MUXs) 908 to 912, and data latches 914 to 918. Logic section 900 can receive data by way of CAM data bus (CAM_BUS), CAM result bus (CAM_RES), and RAM data bus, (RAM_DB).

An address pointer generator 902 can receive a value "i" (also utilized to encode valid bits and/or select a global mask). In response to such a value, address pointer generator 902 can output an address pointer associated with a primary table (e.g., AddPtr[0]) or an address pointer for one of the aggregated data tables (e.g., AddPtr[1] to AddPtr[m]). An address pointer generator 902 may preferably included address registers selectable according to a value "i". Of course, addresses could be generated by alternate means, including an arithmetic operation and/or accessing "hard wired" values.

An adder 904 can provide arithmetic functions for modifying values read from a RAM section, by newly provided data. Adder 906 can add an index value received on CAM result bus CAM_RES with an address pointer value to generate an address for a RAM section. Such operations will be described in more detail below.

Having described the general structure of a logic section portion 900, the operation of such a section during the various functions above will now be described.

Figure 9B:
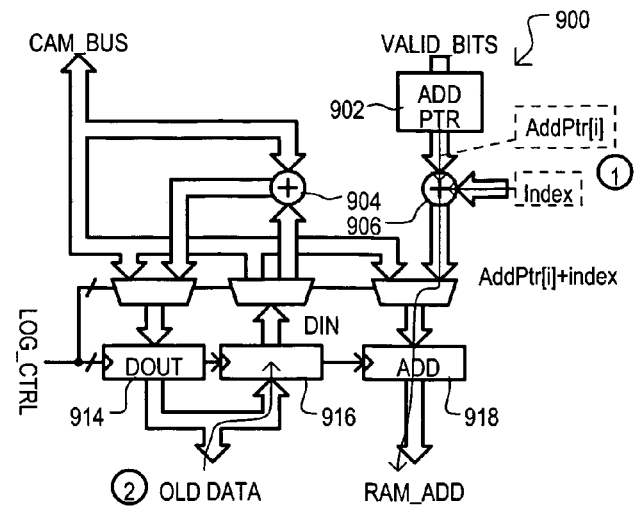
FIGS. 9B to 9F show the operation of the logic section of FIG. 9A during various functions according to an embodiment of the present invention.

FIG. 9B shows the operation of the logic section portion 900 during a particular function: DRead (AddPtr[i]+index). This function can read a data value at a RAM address generated by a search command to CAM section. In such an operation, a value "i" can be applied to address pointer generator 902, to generate an address pointer value AddPtr[i]. In addition, a search operation can generate an index value "index" on CAM result bus CAM_RES. Adder 906 can add these values to generate a RAM address AddPtr[i]+index. Such an address can be applied to RAM section by way of latch 918. In response to such an address, a RAM section can provide read data OLD_DATA. One skilled in the art would recognize that an adder 906 that generates an address value need not be an arithmetic adder, but may simply combine higher order address pointer bits with lower order index bits.

Figure 9C:
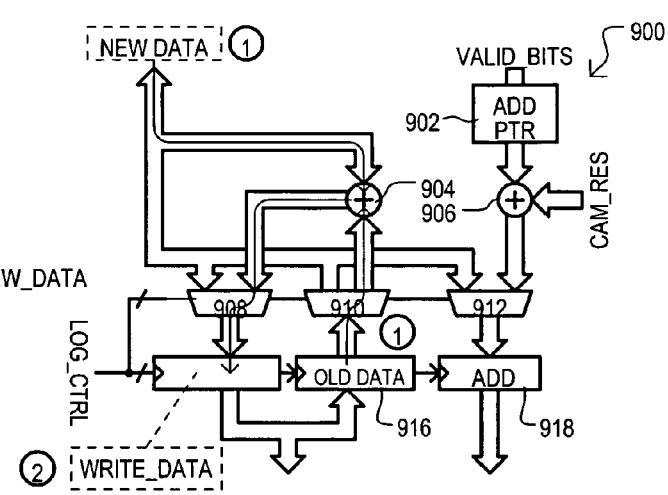

FIG. 9C shows the operation of the logic section portion 900 during another function: WRITE_DATA=OLD_DATA+NEW_DATA. This operation can modify data read from a RAM section with newly arrived data. In such an operation, data previously read from a RAM section (OLD_DATA) can be added to data provided on CAM data bus (NEW_DATA) within adder 904. A resulting value (WRITE_DATA) can be stored in latch 914.

Figure 9D:
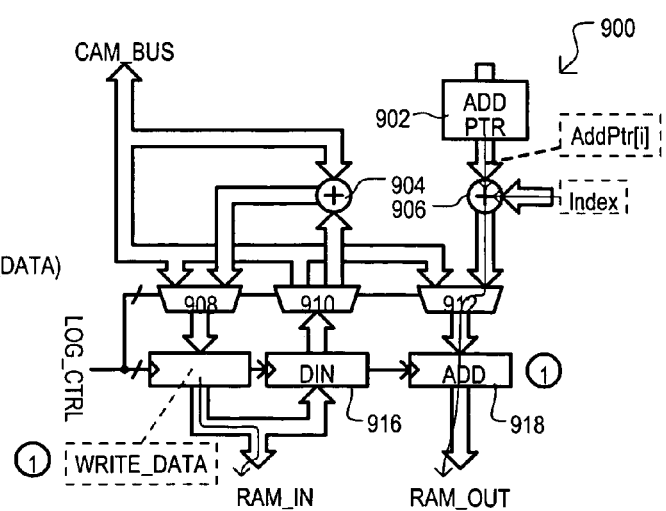

FIG. 9D shows a third operation of the logic section portion 900: DWrite (AddPtr[i]+index, WRITE_DATA). Such an operation can write modified data back into a RAM location. As shown in FIG. 9D, this operation can output modified data (WRITE_DATA) and the address generated as shown in FIG. 9B. Thus, an address (AddPtr[i]+index) can be a value previously generated and stored in latch 918.

The above-described functions can enable higher level operations, as will be described below.

Figure 9E:
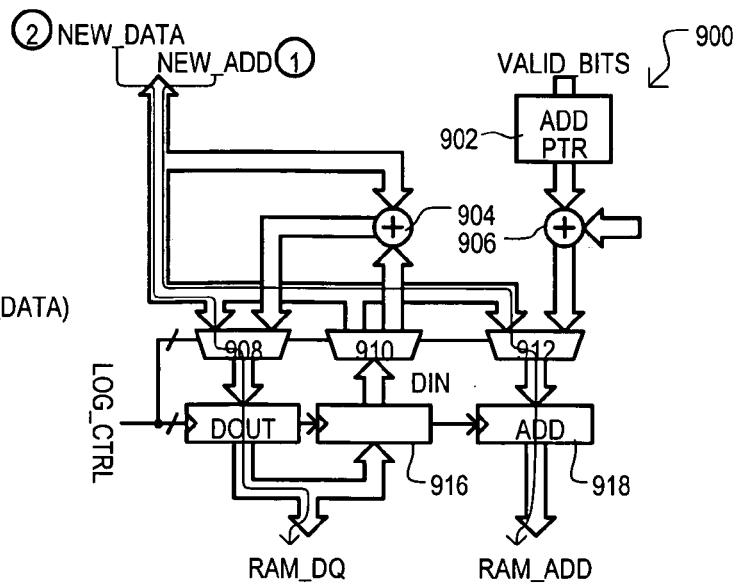
Figure 9F:
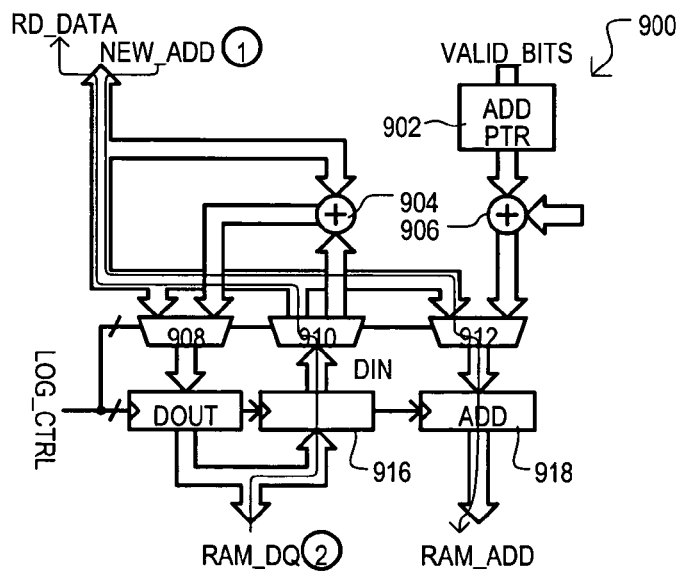

In addition to the above functions, a logic section portion 900 can also provide conventional access to a RAM section. FIG. 9E shows an operation DWrite (NEW_ADD, NEW_DATA) that can write data to a RAM location. In the operation, an address value NEW_ADD from CAM data bus CAM_BUS can be applied by way of MUX 912. This can be followed by a write data value NEW_DATA applied by way of MUX 908. In a similar fashion, FIG. 9F shows an operation DRead (NEW_ADD), which can read a data value from a RAM address.

Second Level Functions—Data Aggregation.

Having described first level device functions and exemplary components, various routines utilizing such functions will now be described with reference to FIGS. 10 to 12B.

GLookUP

Figure 10:
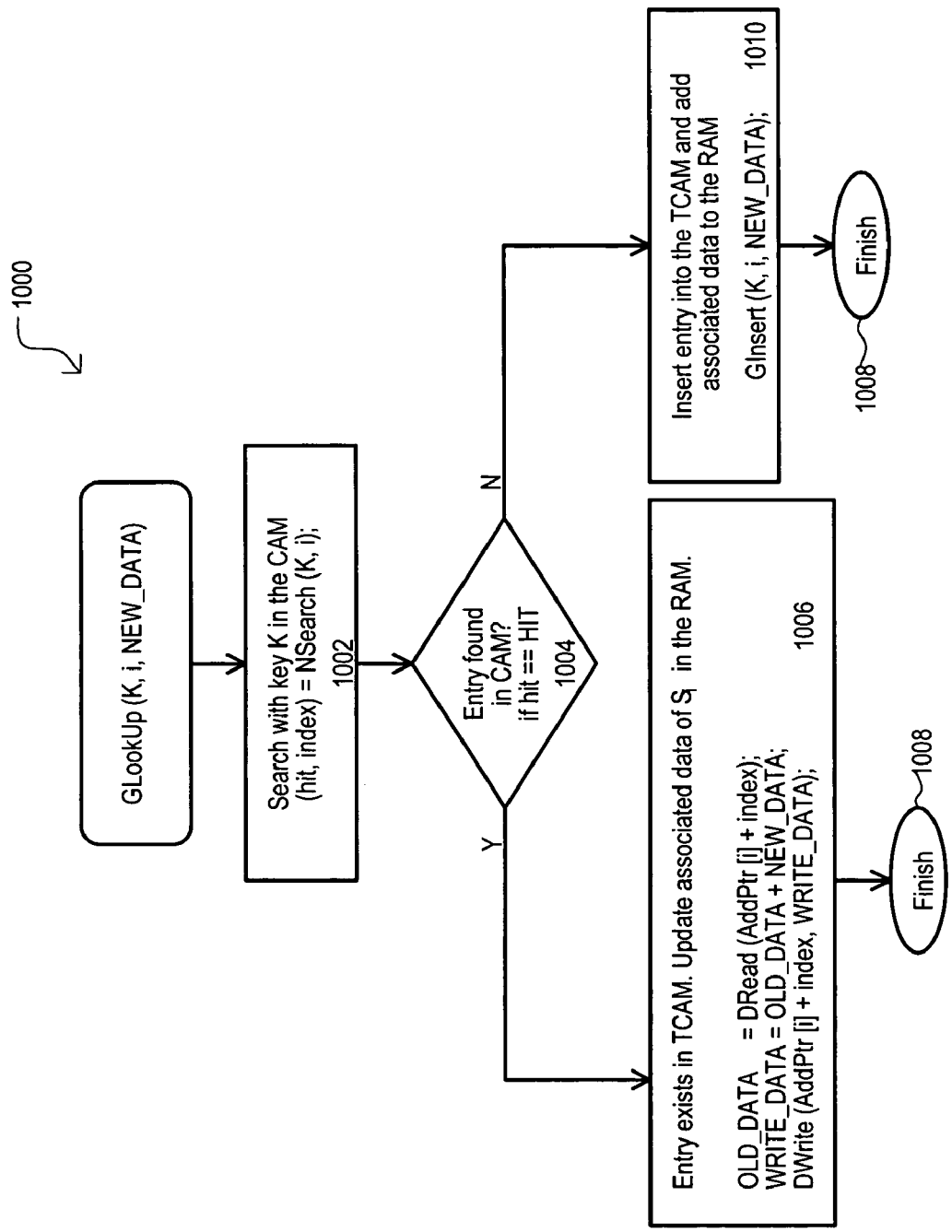
FIG. 10 is a flow diagram showing a look-up function according to one embodiment.

FIG. 10 shows one example of an entry look-up function "GLookUp" according to one embodiment. A GLookUp function can be described according to the following syntax:

GLookUp(K, i, NEW_DATA)

Inputs: K=Search Key; i=scheme ($i^{th}$ global mask in CAM);

NEW_DATA=associated data of a packet.

Referring still to FIG. 10, a GLookUp function is designated by the general reference character 1000 and can include executing a search in a CAM section with a key K and scheme value i (1002). As shown in the figure, this can include performing a first level function NSearch to acquire output values "hit" and "index".

A function can then determine if a matching entry has been found from the search (1004). This can include examining a "hit" output value, and determining if it indicates a hit (hit=HIT).

If the search operation yielded a matching entry (Y branch from 1004), then an entry exists in the CAM section that matches the new key K. Consequently, the appropriate associated data scheme ($S_i$) can be updated based on the value of "i" (1006). In the particular example of FIG. 10, this can include reading "old" data from the appropriate RAM location utilizing the first level function OLD_DATA=DRead(AddPtr[i]+index), updating such data with the operation WRITE_DATA=OLD_DATA+NEW_DATA, and then writing such modified data back into the same RAM location with the function DWrite(AddPtr[i]+index, WRITE_DATA). Following such a write operation, the GLookUp function can end (1008).

If the search operation does not yield a matching entry (N branch from 1004), then no entry exists for the data, and a new (or proxy) entry must be created within CAM section with corresponding data being written into a RAM section (1010). In the example of FIG. 10, this can be accomplished with another second level function GInsert(K, i, NEW_DATA), described in more detail below. Following such an insert operation, the GLookUp function can end (1008).

In this way, a CAM section can be searched to determine if an entry exists that represents a particular scheme (e.g., primary table or aggregate data table). If such an entry exists, the associated data can be updated. If such an entry does not exist, it is created utilizing an existing entry (i.e., creating a proxy) or writing a new entry into a CAM section.

GDelete.

Figure 11A:
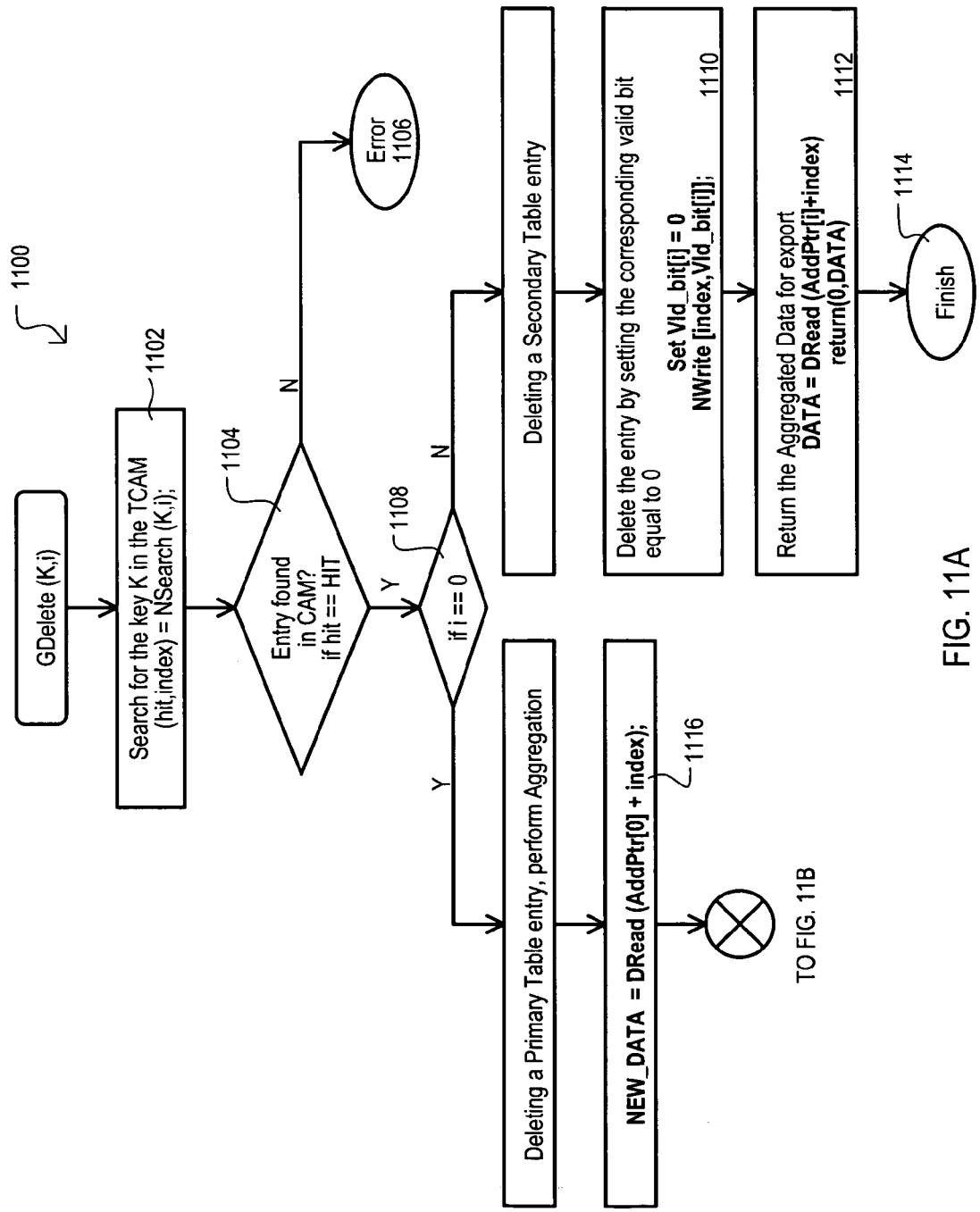
FIGS. 11A and 11B show a flow diagram of an entry deletion function according to one embodiment.
Figure 11B:
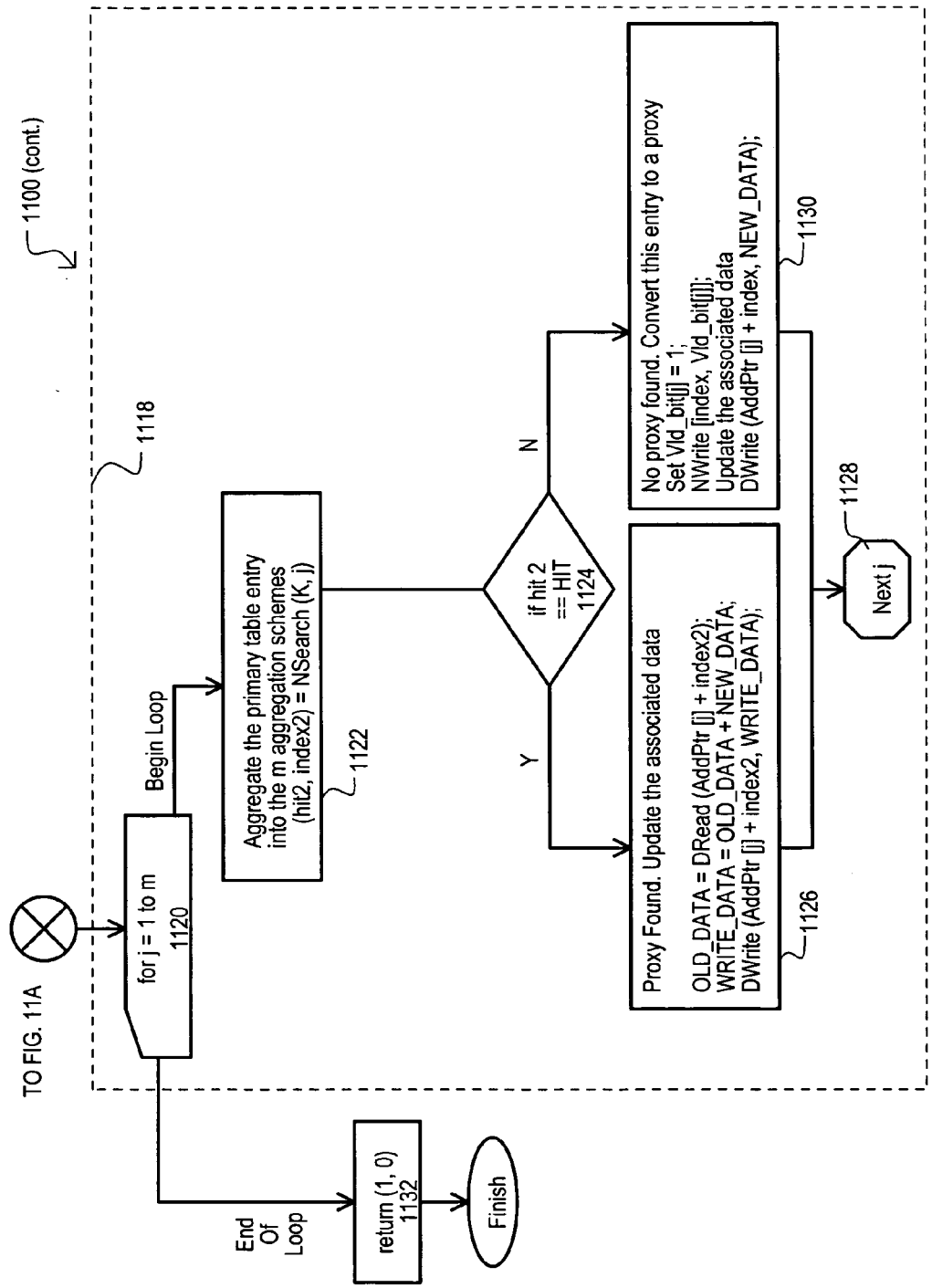

FIGS. 11A and 11B shows one example of a CAM entry delete function "GDelete". A GDelete function can be described according to the following syntax:

GDelete(K, i)

Inputs: K=Search Key; i=scheme ($i^{th}$ global mask in CAM).

Referring to FIG. 11A, a first portion of a GDelete function is designated by the general reference character 1100 and can include executing a search in a CAM section with a key K and scheme value i (1102). As shown in the figure, this can include performing a first level function NSearch to acquire output values "hit" and "index".

The function 1100 can then determine if a matching entry has been found from the search (1104). This can include examining a "hit" output value, and determining if it indicates a hit (hit=HIT).

If the search operation does not yield a matching entry (N branch from 1104), then no entry exists for the key value. This indicates an error condition (1106). As a result, an error indication can be returned to a requesting device.

If the search operation yields a matching entry (Y branch from 1104), then an entry exists in the CAM section that needs to be deleted, and a scheme value "i" can be checked to determine if the entry for deletion exists in the primary table or is in one of the secondary (e.g., aggregate) tables (1108). In the particular example of FIG. 11A, it is assumed that a value of i=0 indicates the primary table, while values i>0 each represent a different secondary table. Thus, step 1108 can include determining if the value i is zero (i==0).

If the to-be-deleted entry exists in a secondary table (N branch from 1108), then a secondary table entry can be "deleted". It will be recalled, that a same CAM entry can represent both a primary and secondary tables according to valid bit data. Thus, "deletion" of a second table entry can include setting valid bit for the secondary table to a non-active value (in this case 0) (1110). In the example shown, such an operation can include setting the appropriate valid bit to zero based on the received value of "i": Set Vld_bit[i]=0. A new key value can then be written into the CAM entry with such a changed valid bit value utilizing the first level CAM write function: NWrite(index, Vld_bit[i]). This function can be a "masked" write, that only writes the "0" value to the valid bit location corresponding to the "i" value.

Depending upon the particular application, a GDelete function can also include exporting the associated for the deleted secondary table entry (1112). In the example shown, this can include reading out the associated data with a first level function DATA=DRead(AddPtr[i]+index). Such data can then be output with a flag: return(0, DATA). A GDelete function can then end (1114).

Referring still to FIG. 11A, if the to-be-deleted entry exists in the primary table (Y branch from 1108), then the appropriate primary table entry can be "deleted". As but one example, this can represent a particular flow value being aggregated (e.g., flow has timed out, terminated, etc.). Consequently, the latest associated data for the primary table entry can be read out from a RAM section (1116). In the example shown this can be accomplished with a first level function: NEW_DATA=DRead(AddPtr[0]+index).

Referring now to FIG. 11B, deletion of a primary entry can continue by updating all current aggregation schemes according to the newly read data from the deleted primary entry (1118). In the particular example of FIG. 11B, this can include aggregating data for all secondary tables. Assuming that a value i=0 corresponds to a primary table, this can include aggregating for all values i>0 (1120). This is shown in FIG. 11B by the conditional operation "for j=1 to m".

Aggregating for a deleted primary table entry can first include searching for an existing primary table that currently represents the aggregation scheme (1122). This is shown in FIG. 11B by execution of a first level search function aimed at the current secondary table: (hit2, index2)=NSearch(K, j). It is understood that such a step can include the masking out of non-relevant fields.

The function 1100 can then determine if a matching entry has been found from the secondary table search (1124). This can include examining a "hit2" output value, and determining if it indicates a hit (hit2=HIT). Such a search result can indicate whether another entry already exists that represents the aggregate data (a "proxy" exists), or whether the to-be-deleted entry must be converted into a proxy entry (an entry that can represent one or more secondary tables).

If the search indicates that an entry exists for the aggregation scheme (Y branch from 1124), then a proxy exists. Thus, corresponding associated data for the proxy entry is updated with the associated data of the deleted primary entry (1126). In the example of FIG. 11B, this can be accomplished with first level functions. In particular, function OLD_DATA=DRead(AddPtr[j]+index2) can retrieve associated data for the secondary table by searching with the proxy entry values. Such read data can be added with the deleted entry data with the operation WRITE_DATA=OLD_DATA+NEW_DATA. Such data can then be written back as updated associated data for the secondary table by writing based on the proxy entry values: DWrite(AddPrt[j]+index2, WRITE_DATA). Following such operations, a function can proceed to a next aggregation scheme (1128).

If the search indicates that an entry does not exist for the aggregation scheme (N branch from 1124), then the primary entry being deleted is converted into a proxy entry for the secondary table (1130). In the example of FIG. 11B, this can be accomplished with first level functions. In particular, a valid bit for the current secondary table can be set to an active value Set Vld_bit[j]=1. The valid bit for the primary entry is then changed with a masked write operation NWrite (index, Vld_bit[j]). Associated data for the new secondary table can then be created by writing to associate data of the primary entry to the appropriate RAM location DWrite (AddPtr[j]+index, NEW_DATA). Following such operations, a function can proceed to a next aggregation scheme (1128).

Once all aggregation schemes have been checked (End of Loop branch from 1120), a GDelete function can return a predetermined indication showing the operation has been completed (1132). This is represented in FIG. 11B by the operation "return (1,0)".

In this way, when a primary table entry is deleted, its associated data is aggregated to an existing secondary table according to an already existing proxy entry, if possible. If not possible, the entry is converted into a proxy entry for non-represented aggregation schemes.

GInsert.

Figure 12A:
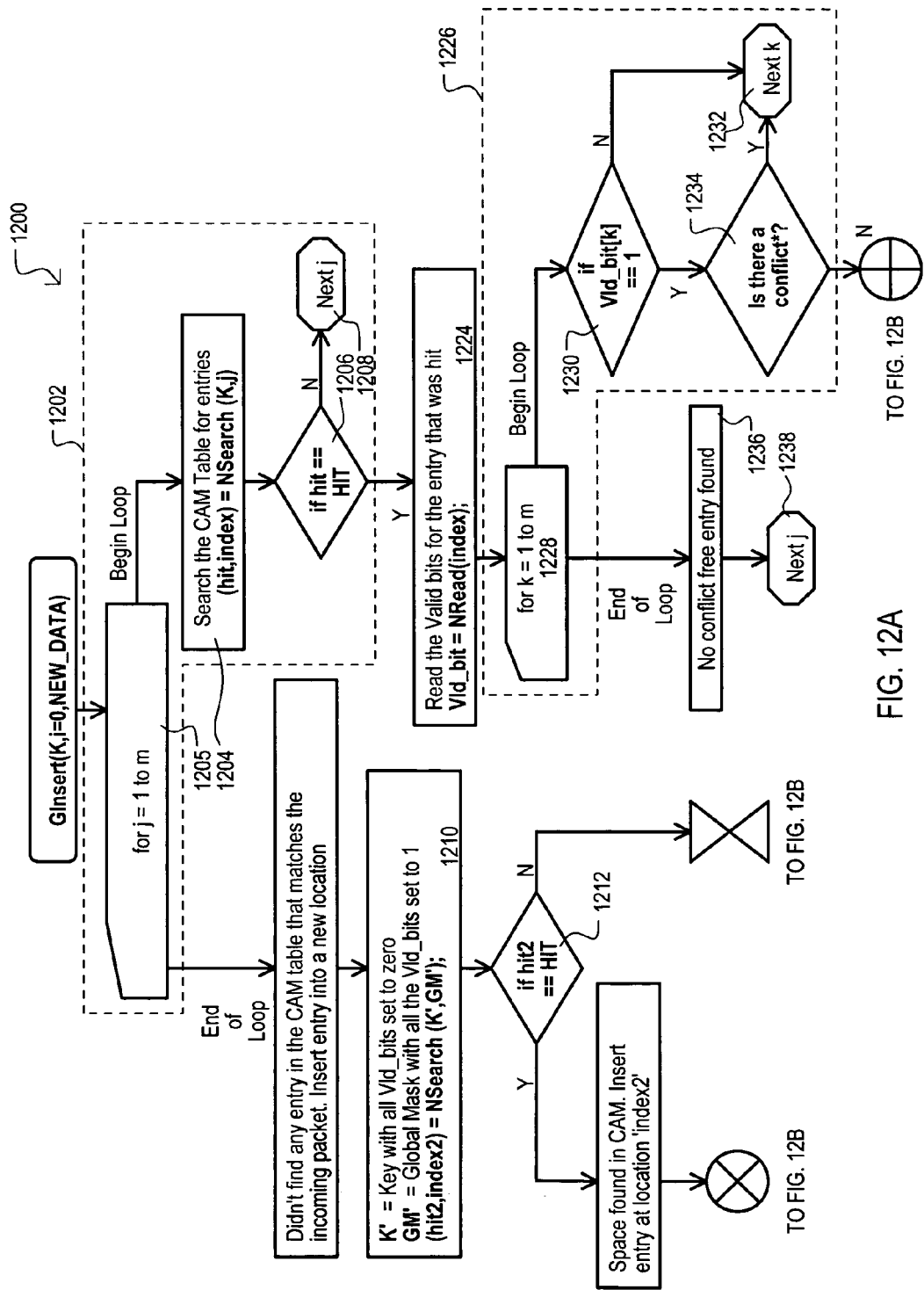

FIGS. 12A and 12B shows one example of a CAM entry insert function "GInsert". It will be recalled that such a function can be included in the GLookUp function described with reference to FIG. 10. A GInsert function can be described according to the following syntax:
Success=GInsert (K, i=0, NEW_DATA)
Inputs: K=Search Key; i=0 (primary table);
NEW_DATA=associated data
Outputs: Success=a flag indicating success/failure of insertion of entry Referring to FIG. 12A, a GInsert function can first check for CAM entries that match a value to be inserted, but correspond to one or more secondary tables (1202). This is shown in FIG. 12A by a first level search operation (hit, index) =NSearch(K,j) (1204) searching CAM entries based on valid bit locations 1 to m (1205).

Following each such search, a hit indication can be checked to see of an entry exists that matches (1206). If no entry exists for the current secondary table, a search based on a next secondary table can take place. This is shown by the Next j step (1208).

If all possible secondary table searches yield no matches ("End of Loop" path from 1205), then no entry currently exists that matches the newly arrived data. A CAM section can then be examined for an available entry (1210). In the particular example of FIG. 12A, this can include generating a new search key K'having all valid bits set to zero. Further, a global mask GM'can be generated having all valid bit locations set to non-mask states (in this case all 1's). A first level function search can then be performed with such values (hit2, index2)=NSearch(K',GM').

In this way, a CAM section can be searched for entries not belonging to any scheme (all valid bits=0).

A resulting search result can then be examined for a HIT result (1212).

Referring now to FIG. 12B, if no hit results (N branch from 1212), then there is no available entry in a CAM section. A GInsert function can return an unsuccessful result value return(0) (1214). The GInsert function can then end (1216).

If a hit does result (Y branch from 1212), an entry is available in the CAM section, and the newly arrived data can be written to such a location (1218). In the particular example of FIG. 12B, this can include setting a primary scheme valid bit to an active value Set Vld_bit[0]=1. A key value K'can then be generated that includes the new valid bit values K'=[K, Vld_bit[0]]. Such a value can then be written to the location indicated by the search: NWrite (index2, K').

Having created a new primary table entry, associated data for the entry can be written to the appropriate location in a RAM section (1220). In the example of FIG. 12B, this can be accomplished with a first level RAM write function DWrite (AddPtr[0]+index2, NEW_DATA). A GInsert function can then return an indication that the function is complete (1222).

Referring back to FIG. 12A, if an initial search for the to-be-inserted data indicates a hit (Y branch of 1206), the valid bits for the matching entry can be examined. In the example of FIG. 12A, this can include utilizing a first level RAM read function Vld_Bit=NRead(index).

Once the valid bits for the matching entry have been read. The bits can be examined to determine if the matching entry represents a conflict. In the arrangement shown, a conflict can occur when a CAM entry serves as a proxy for multiple entries (1226). That is, will the insertion of the new entry value cause a conflict with an existing aggregation scheme. In the example of FIG. 12A, this can include examining each valid bit to see if it is active (1228 and 1230). If a valid bit location is not active (N branch from 1230), a next bit value can be examined (1232). If a valid bit location is active (Y branch from 1230), it can be checked to determine if it raises a conflict (1234).

Checking for a conflict can include confirming that writing inserted data (K) will not invalidate a current proxy entry. For example, the field data representing an aggregation scheme corresponding to the active valid bit can be checked to ensure it matches that of the to-be-inserted primary entry data. If the data fields match, there is no conflict for the particular proxy entry. If the data fields do not match, there is a conflict, and the primary entry data is not suitable for the location.

If a bit location presents a conflict (Y branch of 1234), a next bit location can be checked (1232). If all active bit locations found present a conflict, a next second location can be examined by proceeding to a next "j" value (1236).

Referring now to FIG. 12B, if a bit location does not present a conflict (N branch of 1234), the entry can be "inserted" at the matching CAM location (1236). In the particular example of FIG. 12B, this can include setting a primary scheme valid bit to an active value Set Vld_bit[0] =1. A key value K'can then be generated that includes the new valid bit values K'=[K, Vld_bit[0]]. Such a value can then be written to the location indicated by the search: NWrite (index, K').

Having written the new data value in the existing CAM entry, associated data for the entry can be written to the appropriate location in a RAM section (1238). In the example of FIG. 12B, this can be accomplished with a first level RAM write function DWrite (AddPtr[0]+index, NEW_DATA). A GInsert function can then return an indication that the function was successful (1240).

A function can then break out of examining valid bits (1242), and the function can end.

In this way, when a new entry is to be added to a database, an entirely new entry can be added, or an existing entry can be converted (by setting valid bits) to function as a "proxy" for such an entry.

Third Level Functions.

Having described first level device functions, and higher second level functions that can utilize first level functions, a higher (third) level function (referred to herein as an application) will now be described.

Figure 13:
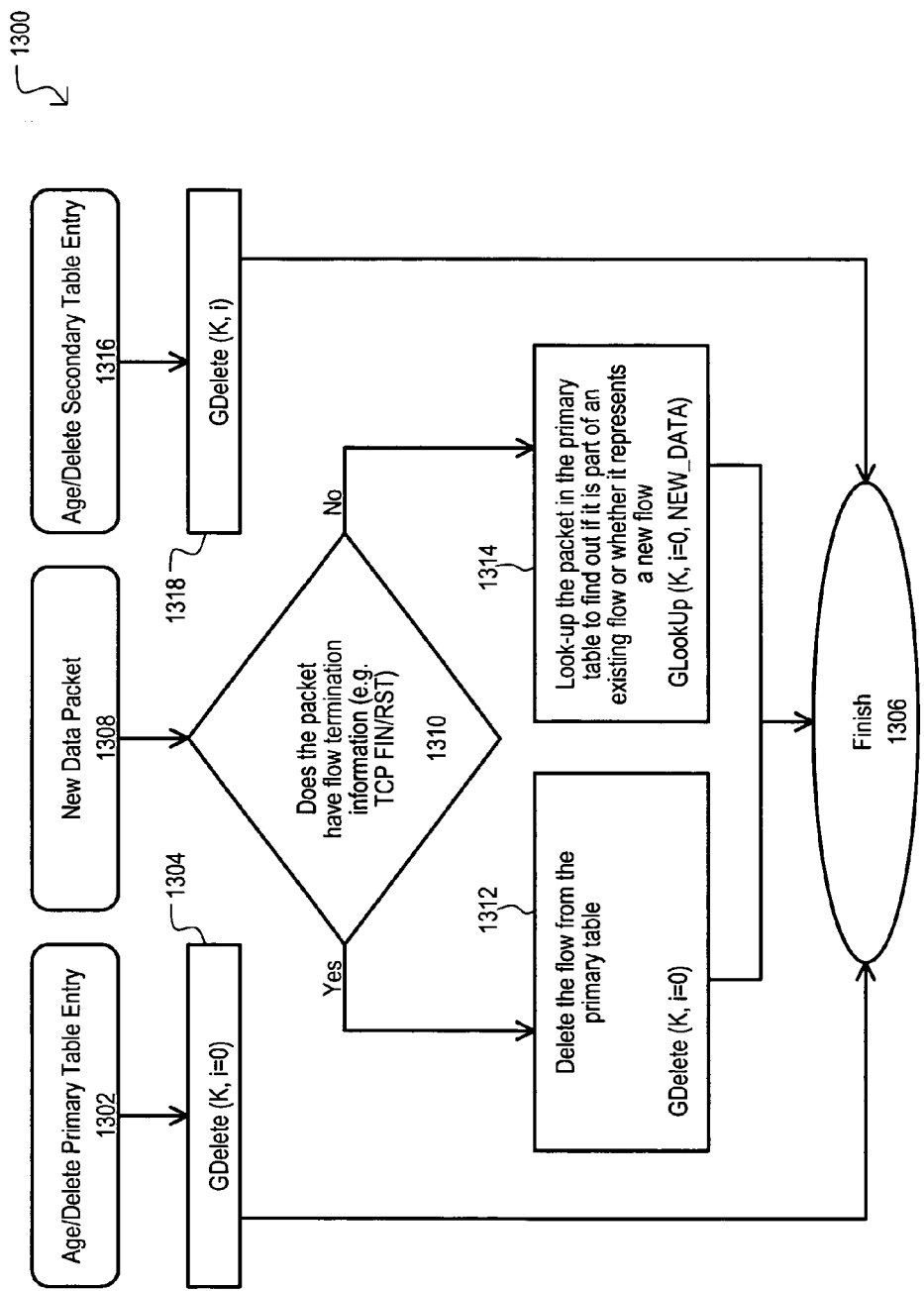
FIG. 13 is a flow diagram of an application function according to one embodiment.

Referring now to FIG. 13, an application 1300 can execute various second level functions according to particular events. One such application can include the deletion of a primary table entry (1302). As but a few examples, such an event can occur when an existing flow has been idle too long, has exceeded a particular duration, or the primary table is full, necessitating deletion based on more aggressive criteria. In such an event, an application 1300 can execute the GDelete function (1304), utilizing a key value K to identify the entry for deletion, as well as a scheme value i=0, which targets a primary table entry.

As will be recalled, such a function can delete the primary table entry, automatically create secondary table aggregate data, and convert the primary table into a "proxy" entry, or utilize an existing entry as a proxy for such aggregate data. Following such a function, the application can be finished (1306) (e.g., can be ready to operate in response to more events).

In this way, aggregate data can be rapidly generated as CAM look-ups are utilized, while at the same time needing far fewer CAM entries, through the use of "proxy" entries.

Another application event can include the arrival of a new packet (1308). In the very particular example of FIG. 13, in response to new packet, an application 1300 can determine if the packet signifies the end (or reset) of a flow (1310).

If the new data packet indicates the end of a flow (Y branch from 1310), the application 1300 can delete the flow from the primary table. In the example of FIG. 13, this can be accomplished by calling the GDelete function (1312) using a key value generated from the new data packet, as well as a scheme value i=0 to designated the primary table. The application can then be finished (1306).

If the newly arrived packet does not indicate the end of a flow (N branch from 1310), the application 1300 can look in the primary table to see of the packet represents an existing flow, or represents a new flow. In the example of FIG. 13, this can be conveniently accomplished by calling the GLookUp function (1314) using a key value K generated from the new data packet, as well as a scheme value i=0 to designated the primary table. Such a function can use the data of the new packet (NEW_DATA) as new associated data (in the case of a new flow), or add such data to existing associated data (in the case of an existing flow). The application can then be finished (1306).

Another application event can include the deletion of a secondary table entry (1316). As but one example, such an event can occur when aggregated flow data is been exported for analysis.

In such an event, an application 1300 can execute the GDelete function (1318), utilizing a key value K to identify the entry for deletion, as well as a scheme value i, which targets a secondary table.

As will be recalled, such a function can set a particular valid bit for a primary table entry that corresponds to the secondary table. Further, aggregated data for the secondary table can be read for export. Following such a function, the application can be finished (1306).

In this way, secondary table "entries" can be deleted by setting particular bit values of a "proxy" entry.

Figure 14:
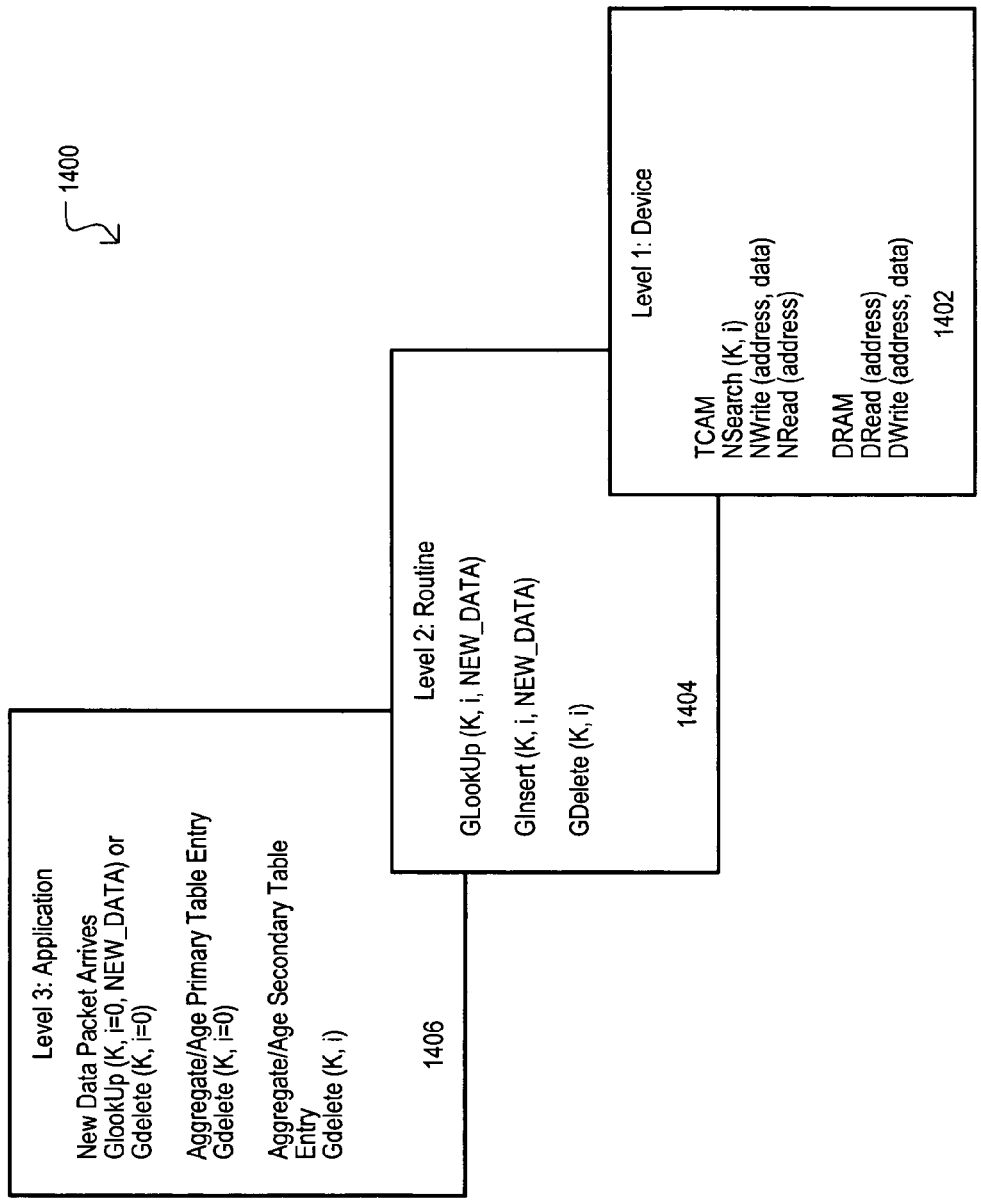
FIG. 14 is a diagram showing how each higher level function can utilize lower level functions to provide data aggregation operations.

The various functions described above can be arranged into a hierarchy as shown in FIG. 14. The hierarchy 1400 shows the various functions described above. In the particular arrangement shown, level 1 function 1402 can be provided at a device level. As but one example, such functions can be provided by hardware on a CAM device or section.

Level 2 functions 1404 can be provided at routine level. As noted previously, such functions can be provided by hardware, software or some combination thereof. More particularly, one or more such functions (or steps executed by the functions) may be provided by an ASIC or logic separate from a CAM device, or a logic section incorporated in to a CAM device, or by steps executed by a processor according to an instruction set.

Level 3 functions 1406 can be provided at an application level. For example, a system may perform the functions in combination with other hardware components. More particularly, a router or switch system may provide network flow monitoring and data aggregation with such an application.

Performance Examples

Having described both devices and methods according to the present invention. Performance examples of data aggregation according to the above embodiments will now be described. The following examples are based on assumed network traffic values. These values have been generated from an empirical study shown in "Their share: diversity and disparity in IP traffic", by Broido et al., and are as follows:

Average Number of Packets per Flow = 17
Average Bytes per Packet = 576
Average Bytes per Flow = Average Number of Packets per Flow * Average Bytes per Packet
 = 9792

These values can be used to calculate flow update rates for various line speed values. A tabulation of such calculations is shown in FIG. 15. To better understand how such values are generated, the calculations for one line of the table (line speed of 10 Gbps) is shown below:

Line Rate = 10 Gbps
Average Packet Size = 576 bytes (from Broido et al.) = 4608 bits
Average Packets per flow = 17 (from Broido et al.)
Average Packets per second = Line rate/bits per packet =
 10 Gbps/4608 bits
 = 2.1 Mpackets/s
Average Flow Rate = Packets per second/Packets per flow
 = 2.1 Mpackets/s/17 Packets per flow
 = 124 k flows/s
Average Update Rate = Entry addition rate + Entry deletion rate
 = 124 k + 124 k = 248 k updates/s Referring to FIG. 15, as line speed is increased, average update rates can rise considerably. In the case of hashing, non-deterministic search operations particularly in the case of "funneling" and the like, may not be capable of meeting the very fast look-up rates needed.

Referring now to FIG. 16, a table is shown illustrating the number of first level (device) functions needed to execute the various second level (routine) functions described above.

Using the information from table of FIG. 16, a needed rate for a fastest illustrated line speed can be calculated as follows. This example assumes that the number of aggregation schemes is eight (i.e., m=8), and that the protocol is an Ethernet type protocol. Further, the rate at which secondary table entries are deleted is assumed to be an order of magnitude less than the rate at which primary table entries are deleted. This value is used as the system implements data aggregation, thus reducing the rate at which aggregate data is collected. It is assumed that such a reduction is not only possible, but also a desirable feature to a network administrator.

Using such assumptions the following calculations can be made for a line rate of 10 Gbps running Ethernet:

Peak Packets per Second = 60 Mbps
Primary Table look-up rate = Peak Packets per second = 60 Mpps
Primary Table insert rate = Average Flow Rate = 500 k (0.5 M)
Primary Table deletion rate = Average Flow Rate = 500 k (0.5 M)
Secondary Table deletion rate = 50 k (0.05 M)

The above calculations can be used to generate the table of FIG. 17. FIG. 17 shows the total rate at which device operations (i.e., level 1 functions) need to be executed to meet the 40 Gbps line rate example described above. As shown, 66 million searches per second would be needed to meet update speeds for such a fast line speed. While such a rate might be difficult and/or complex to meet with a hashing solution, a high performance CAM device is capable of such high search rates. As but one example, the Ayama 10000 NSE manufactured by Cypress Semiconductor Corporation of San Jose, Calif., is capable of performing 266 million searches per second, easily meeting the needed high search rate.

While a high performance CAM device can meet the above noted CAM access rates, RAM access rates could present another bottleneck. However, a number of different approaches can be used to increase overall RAM access rate. Two possible examples are shown in FIGS. 18A and 18B.

Figure 18B:
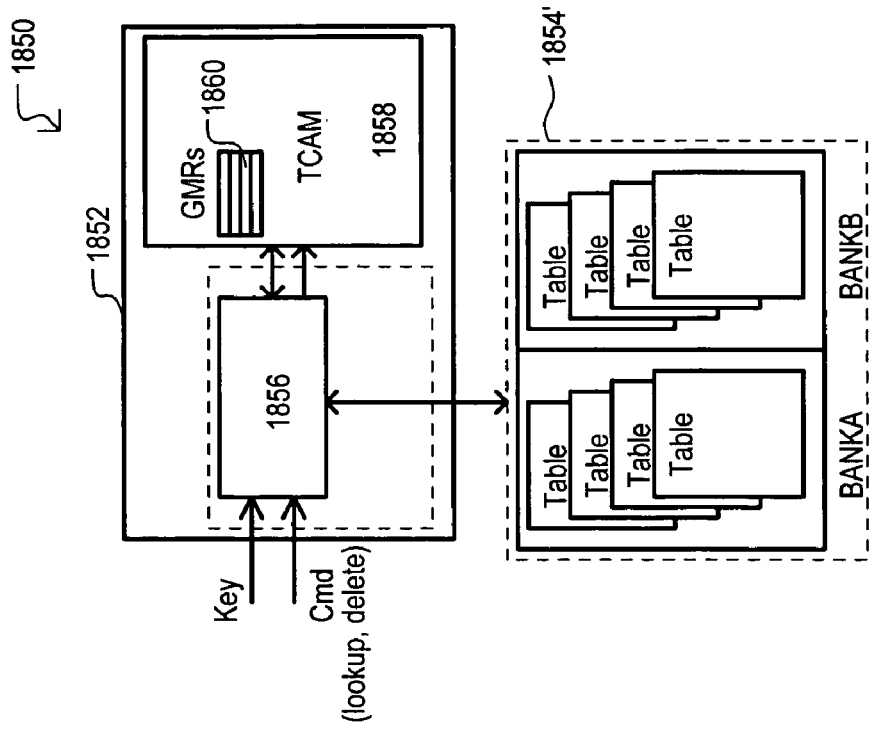
FIGS. 18A and 18B are block diagrams of alternate embodiments of the present invention.
Figure 18A:
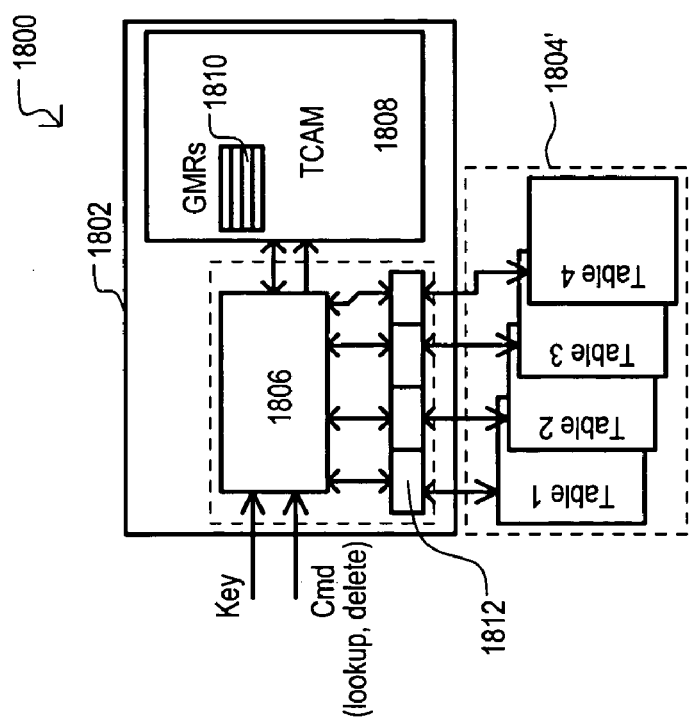

FIG. 18A is block diagram showing the same general components as that of FIG. 4. However, unlike FIG. 4, a system 1800 can include multiple RAM interfaces 1812, each corresponding to a different table (only four are shown in this example). In this way, a write/read to one table need not be completed before the next table can be accessed. Such an arrangement could meet any bottleneck presented by lower RAM access speeds.

FIG. 18B is block diagram showing the same general components as that of FIG. 4. However, unlike FIG. 4, a system 1850 can include a RAM section 1854' composed of multiple banks (only two are shown in this example). In such a "bank select" arrangement, tables can be replicated into different banks within the same RAM device. In this way, a write/read to one table in one bank, can be followed by a read/write to a next table in a different bank. This can also lead to faster access rates.

Of course, one skilled in the art could arrive at various conventional approaches for improving RAM access speeds to meet the fast search speeds of a CAM section.

System and Device—Type of Service

Figure 19:
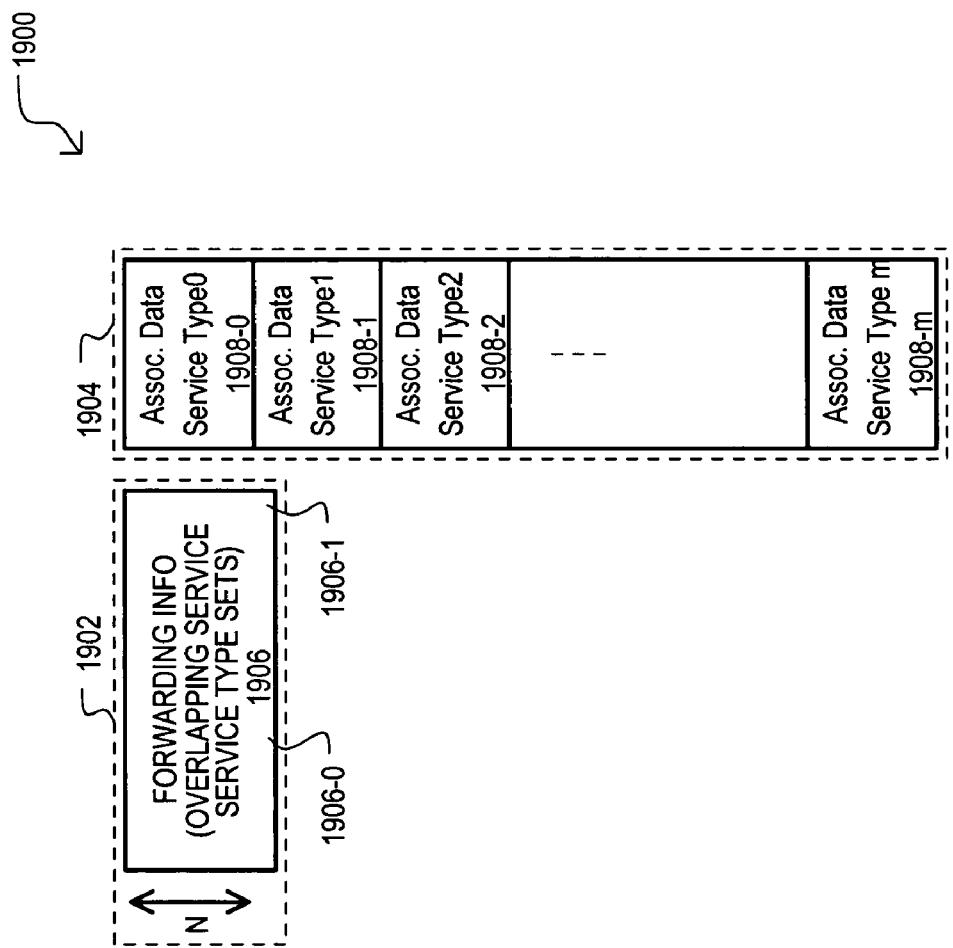
FIG. 19 is a block diagram of another embodiment of the present invention.

A system for providing packet forwarding functions according to a service type is set forth in a block diagram in FIG. 19 and designated by the general reference character 1900. A system 1900 can include the same general components as the system of FIG. 2. However, unlike the arrangement of FIG. 2, in FIG. 19 each physical entry of CAM portion 1902 can store key searchable data for forwarding packet data.

In this case, such data can be a destination address of a packet, for example. By use of global masking and service defining bit values, such entries can serve as key data for multiple service types of a same destination. As a result, in FIG. 19, a system 1900 can include one table for destinations regardless of service type, instead of multiple tables (one table for each service type).

In a preferred arrangement, a single bit (e.g., valid bit) can distinguish between each different service type.

An associated data portion 1904 can store associated data for all service type tables. For example, associated data portion 1904 can include first forwarding data area 1908-0 for storing forwarding data (e.g., next hope information) for a first service type. Data areas 1908-1 to 1908-$m$ can store associated data corresponding to "m" other service types.

As is well understood, a different service type may provide a higher or lower quality of service, or be designated for predetermined data packet payload (e.g., audio, video, etc.).

As in the case of FIG. 2, an associated data portion 1904 can preferably be formed from RAM devices, even more preferably from DRAM, which may provide an advantageously low cost per bit.

In this way a system 1900 can provide high look-up rates (CAM speed) to associated data in a tables totaling (m+1)*N RAM entries, with only about N CAM entries.

Figure 20:
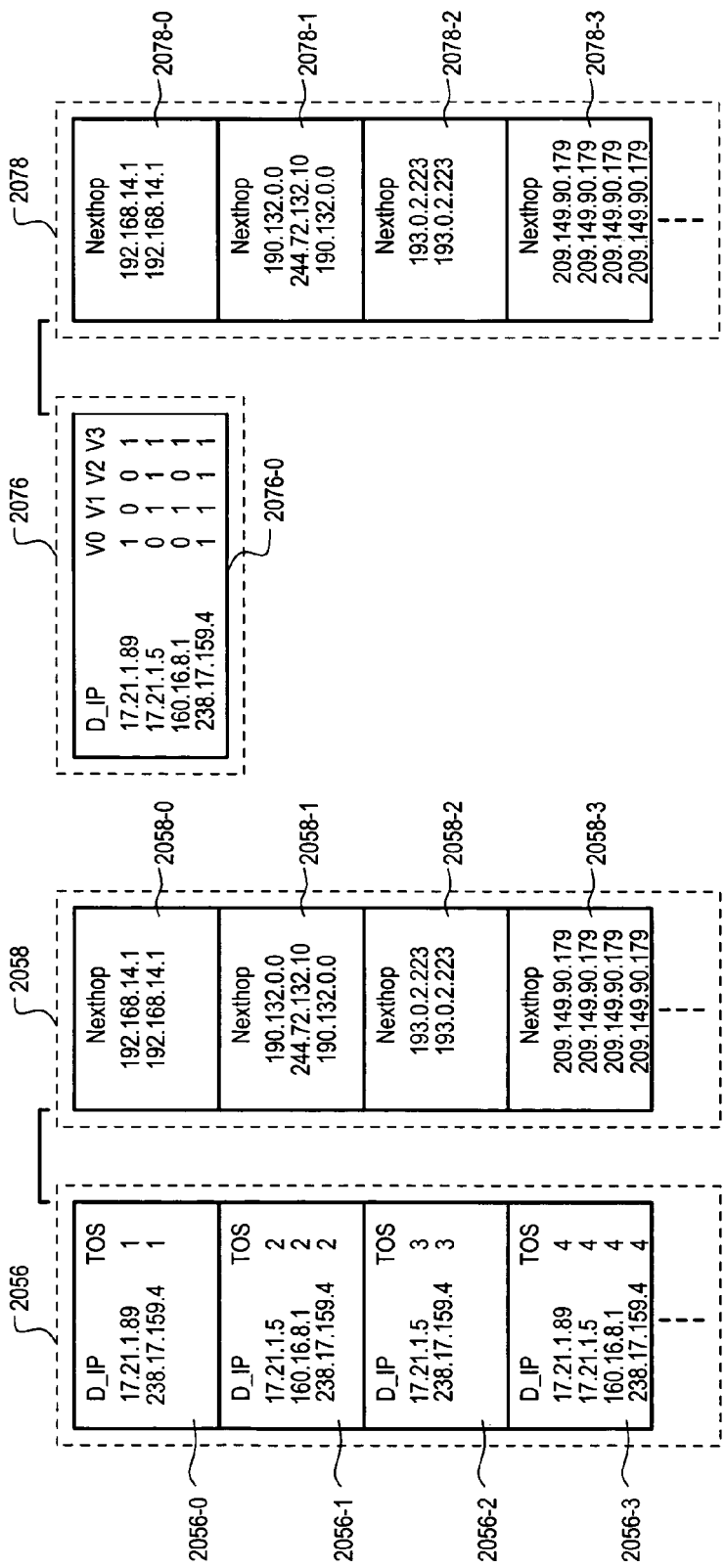
FIG. 20A is a block diagram showing a conventional example of forwarding data sets.
FIG. 20B is a block diagram showing virtualization of the same forwarding data sets as FIG. 20A according to an embodiment of the present invention.

To better understand service type lookups according to the present invention, one very particular example is shown in FIGS. 20A and 20B.

FIG. 20A shows a conventional approach for storing service values in a CAM section 2056 and associated data in a RAM section 2058. Thus, CAM section 2056 includes search tables 2056-0 to 2056-3, each of which stores lookup data for identifying a destination (in this case IP destination address "D_IP") and corresponding service type (TOS). In the very particular example of FIG. 20A, search tables 2056-0 to 2056-3 include four service types (1-4).

Forwarding associated data are also shown in FIG. 20A. In particular, associated data tables 2058-0 to 2058-3 are shown, which correspond to search tables 2058-0 and 2058-3. In the very particular example shown, each associated data table (2058-0 to 2058-3) stores a nexthop address for forwarding a packet according to the corresponding service type.

FIG. 20B shows how the data illustrated in the conventional case of FIG. 20A can be more compactly fit into a single CAM table. Thus, FIG. 20B shows only one table 2076-0 in CAM section 2076 containing the four entries, each storing one of the destination addresses of FIG. 20A. Each entry also defines one or more types of service for the destination address, shown by valid bits "V0" to "V3".

Thus, each physical CAM entry can serve as a "proxy" entry to represent an additional service type. This is shown by a valid bit (V0 to V3) being set to "1" for these entries.

A RAM portion 2078 of FIG. 20B can be essentially the same as that of FIG. 20A.

Of course, FIG. 20B represents but one possible application of the present invention.

Second Level Functions—Type of Service.

The above first level device functions and exemplary components can also be utilized by functions related to type of service applications, as described below and with reference to FIGS. 21 and 22.

FIBLookUP

A "FIBLookup" function can be simpler than a "GLookup" function, like that shown in FIG. 10, as aggregation is not included. A FIB Lookup can described according to the following syntax:

FIBLookUp(K, i, NEW_DATA)

Inputs: K=Search Key; i=type of service (TOS) ($i^{th}$ global mask in CAM);

NEW_DATA=associated data of a packet.

In one arrangement, this function can include performing a first level function NSearch to acquire output values "hit"

and "index". A function can then determine if a matching entry has been found from the search. This can include examining a "hit" output value, and determining if it indicates a hit (hit=HIT).

If the search operation yielded a matching entry, then an entry exists in the CAM section that matches the new key K. If the search operation does not yield a matching entry, then no entry exists for the data, and a new entry must be created within CAM section with corresponding data being written into a RAM section. In one arrangement, this can be accomplished with another second level function FIBInsert (K, i, NEW_DATA), described in more detail below. Following such an insert operation, the FIBLookUp function can end.

FIBDelete.

Figure 21:
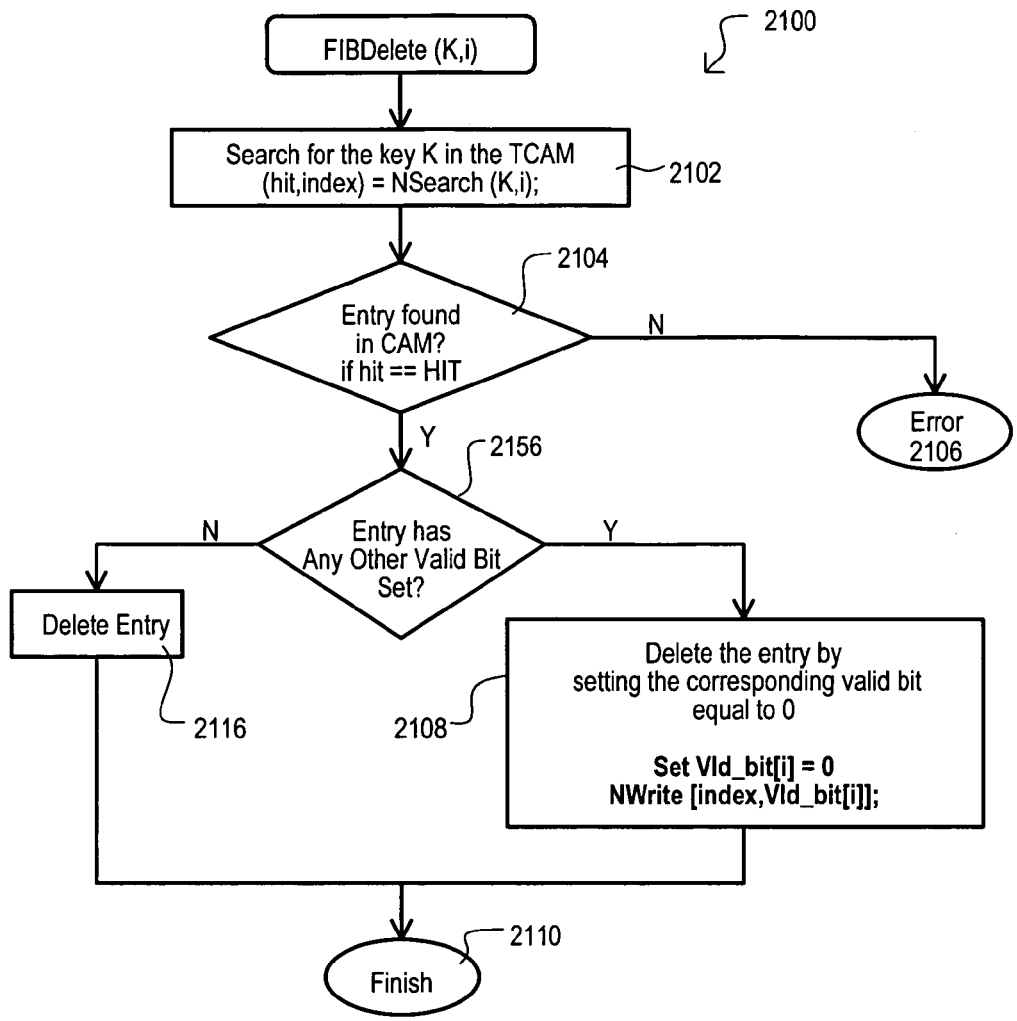
FIG. 21 is a flow diagram of an entry deletion function according to another embodiment.

FIG. 21 shows one example of a CAM entry delete function "FIBDelete". A FIBDelete function can be described according to the following syntax:

FIBDelete(K, i)

Inputs: K=Search Key; i=TOS ($i^{th}$ global mask in CAM).

Referring to FIG. 21, a FIBDelete function is designated by the general reference character 2100 and can include executing a search in a CAM section with a key K and TOS value i (2102). As shown in the figure, this can include performing a first level function NSearch to acquire output values "hit" and "index".

The function 2100 can then determine if a matching entry has been found from the search (2104). This can include examining a "hit" output value, and determining if it indicates a hit (hit=HIT).

If the search operation does not yield a matching entry (N branch from 2104), then no entry exists for the key value. This indicates an error condition (2106). As a result, an error indication can be returned to a requesting device.

If the search operation yields a matching entry (Y branch from 2104), then an entry exists in the CAM section that needs to be deleted, and a TOS value "i" can be checked to determine if the entry has any other valid bits set (2156). If the to-be-deleted entry does not include any other set valid bits (N branch from 2156), indicating the entry does not represent a pointer to another TOS, then entry can be "deleted".

If the to-be-deleted entry includes another set valid bit, the CAM entry is representing another data set. Thus, "deletion" of the entry can include setting valid bit for the corresponding TOS indicator to a non-active value (in this case 0) (2108). In the example shown, such an operation can include setting the appropriate valid bit to zero based on the received value of "i": Set Vld_bit[i]=0. A new key value can then be written into the CAM entry with such a changed valid bit value utilizing the first level CAM write function: NWrite (index, Vld_bit[i]). This function can be a "masked" write, that only writes the "0" value to the valid bit location corresponding to the "i" value. FIBInsert.

Figure 22:
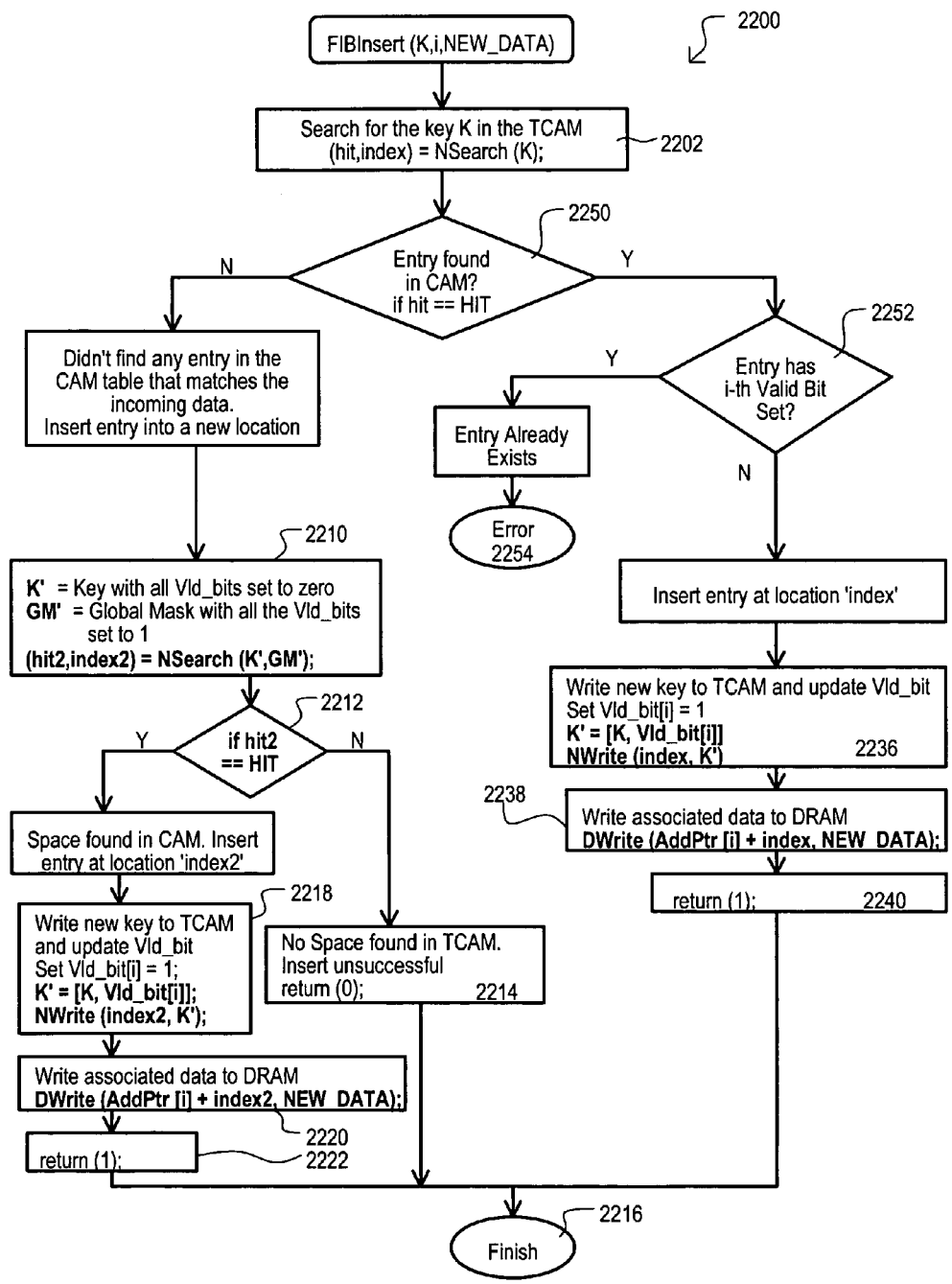
FIG. 22 is a flow diagram of an entry insertion function according to another embodiment.
Figure 23:
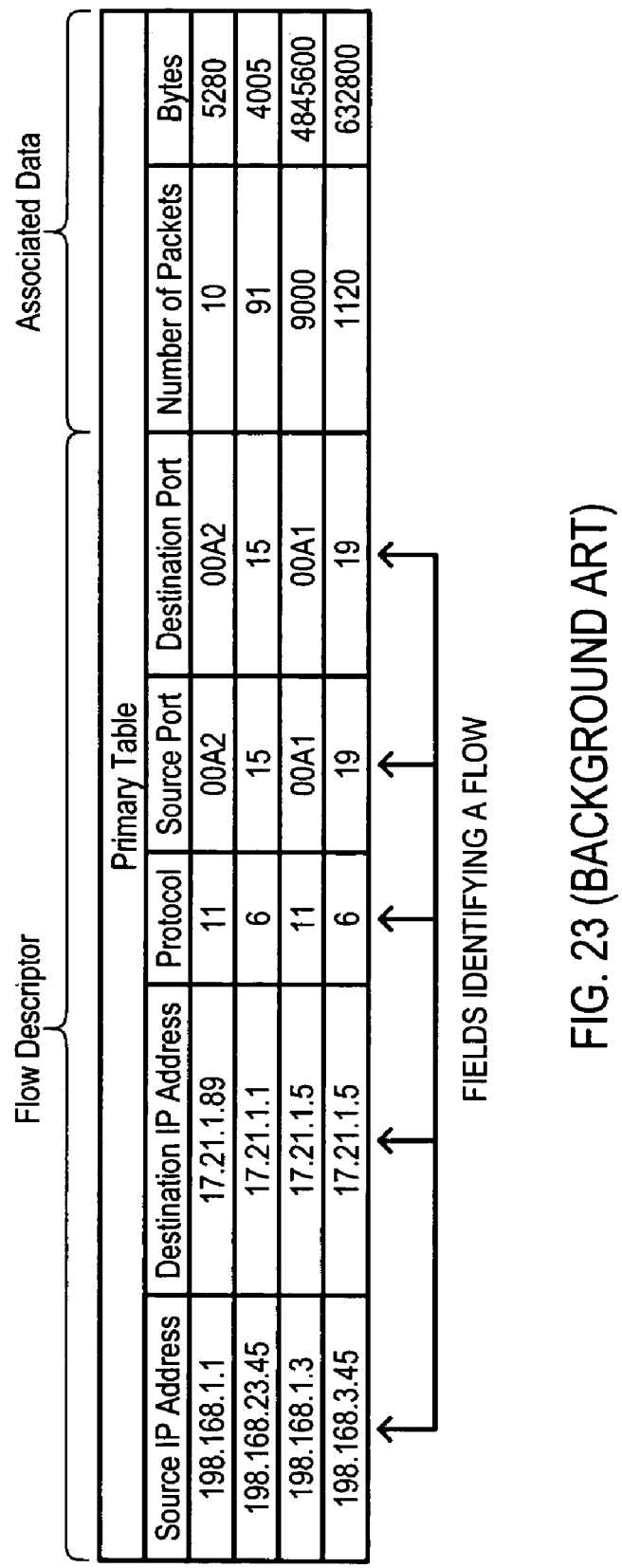
FIG. 23 is a table illustrating flow data of a conventional primary table.
Figure 24:
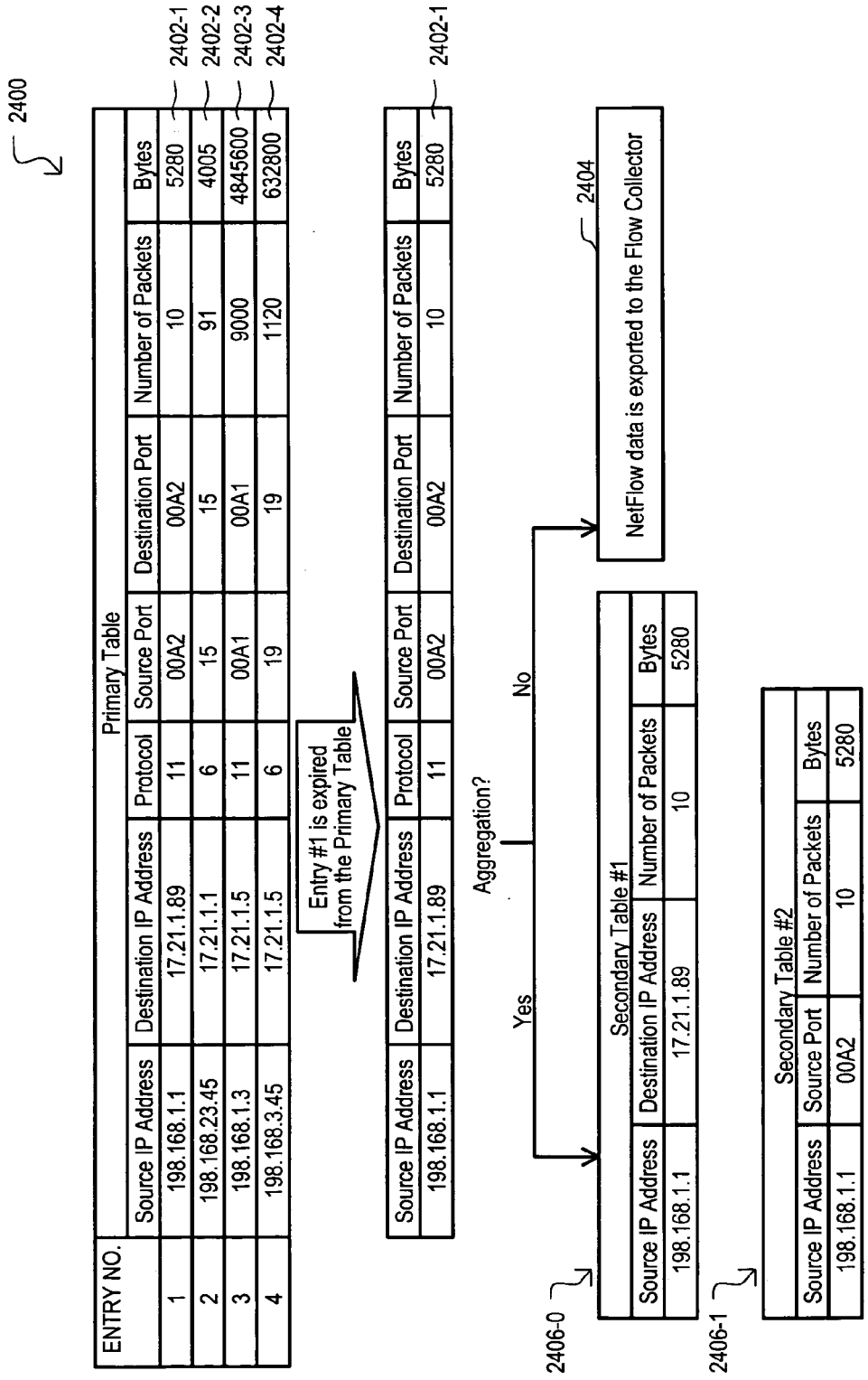
FIG. 24 is a diagram illustrating conventional approaches to flow data aggregation.

FIG. 22 shows one example of a CAM entry insert function "FIBInsert". It will be recalled that such a function can be included in the FIBLookUp function described above. A FIBInsert function can be described according to the following syntax:

Success=FIBInsert (K, i=0, NEW_DATA)

Inputs: K=Search Key; i=TOS;

NEW_DATA=associated data

Outputs: Success=a flag indicating success/failure of insertion of entry

Referring to FIG. 22, a FIBInsert function can first check for CAM entries that match a value to be inserted (2202).

The function 2200 can then determine if a matching entry has been found from the search (2250). This can include examining a "hit" output value, and determining if it indicates a hit (hit=HIT).

If a search yields no match (N branch from 2250), then no entry currently exists that matches the newly arrived data. A CAM section can then be examined for an available entry. This is shown in steps 2210 to 2216. In one arrangement, these steps can be essentially the same as steps 1210 to 1216 of FIGS. 12A and 12B. Accordingly, a description will be omitted. It is noted, however, that NWrite and DWrite functions write data based on the i-th bit location, not a value "i=0".

Referring still to FIG. 22, if a search yields a match (Y branch from 2250), the matching entry can then be checked to see of the i-th bit has already been set. If the i-th bit has been set (Y branch from 2252), an entry already exists for K,i combination, thus indicating an error (2254). If the i-th bit has not been set (N branch from 2252), an entry can be inserted at the location indicated by the returned index value. This is shown in steps 2236 to 2240. In one arrangement, these steps can be essentially the same as steps 1236 to 1240 of FIG. 12B. It is noted, however, that NWrite and DWrite functions based on the i-th bit location, not a value "i=0".

It is understood that while the various embodiments describe particular data aggregation approaches, such approaches should not be construed as limiting the invention to any particular protocol, collection of key fields or numerical operation. Aggregation of data according to the present invention can generally be considered searching a data source for a set of like entities to form a single entity, and arriving at some figure, such as a sum, count or average. An aggregation can be derived by defining rules, or keys, that can determine likeness of data entities. Thus, the present invention should not be construed as being limited to summation as the only aggregation method.

Various embodiments shown above have illustrated a primary table formed in a CAM portion with "N" entries (corresponding to "m" different N sized secondary tables for associated data). However, in operation, the number of entries within a CAM portion may need to exceed N. Such an event can occur when an aggregation entry exists for which there is no corresponding primary table entry. That is, a secondary table may be storing "stale" aggregate data. The number and frequency at which a value N may be exceeded can be dependent upon the particular network in which the invention is employed. However, such a number is expected in most applications to be relatively small, as aggregated data values are not expected to become stale often, as such operations work against the basic motivation for data aggregation.

Accordingly, it may be desirable to provide a CAM portion having a limited number of extra entries for accommodating cases in which stale aggregate data arises.

Alternate Embodiment—No Valid Bits.

While the above embodiments have described data aggregation scheme arrangements in which CAM section entries include valid bits for each scheme, an alternate embodiment may not include such valid bits. Such an alternate embodiment would utilize an offset address generator as described above to access secondary table data based on a scheme value "i". Such an approach could dispense with an NRead type operation in a GInsert function.

According to the above embodiments of the present invention, fast, deterministic data aggregation can be accomplished with considerably less CAM memory than conventional approaches, like those described above. Utilizing less CAM resources can result in a less expensive system.

Still further, because the embodiments can provide deterministic results, the disadvantages associated with collisions do not exist. Along these same lines, the approaches can be implemented without the need for know how regarding hashing. There is no need to worry about selecting an appropriate hashing function to ensure low collision operations for a given network. It follows that by avoiding delays introduced by collisions, the present invention can provide higher throughput rates than hashing approaches.

The above embodiments can provide a single search interface. Thus, second level functions can be conveniently called to perform essentially all the necessary tasks for executing data aggregation.

The above embodiments can provide a system with more flexibility. In the event a CAM section has extra available entries, such entries can be used for other types of searches.

For this reason, the various embodiments of the present invention can enjoy wide application in various industries. As but one example, the systems and methods according to the present invention can be included in network routers or switches to provide data aggregation capabilities without the throughput limitations of hashing approaches, or the high cost of implementing individual primary and secondary CAM tables.

It is also understood that the embodiments of the invention may be practiced in the absence of an element and or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A method of providing multiple data sets for search on a single physical set of storage entries, comprising the steps of:
storing at least one data value of a first data set in one physical entry of a plurality of globally maskable content addressable memory (CAM) entries;
storing at least a second data value of a second data set, different form the first data set, in the one physical entry; and
distinguishing between the first and second data value by applying a predetermined global mask to the one globally maskable CAM entry.

2. The method of claim 1, further including:
storing associated data for each data value of the first data set in a first memory section starting at a first offset location; and
storing associated data for each data value of the second data set in a second memory section having different addresses than the first memory section, the second memory section starting at a second offset location.

3. The method of claim 1, wherein:
the first data set includes a network flow primary table and the second data set comprises at least one aggregation scheme;
the step of storing at least one data value of a first data set in the one physical entry includes storing network flow information in corresponding physical CAM entries to form network flow entries of the primary table;
the step of storing at least a second data value in the one physical entry comprises using an existing primary network flow entry as an aggregation entry that corresponds to the at least one aggregation scheme; and
storing associated data for each flow entry in a first associated data area, storing associated data for each aggregation scheme in a different associated data area.

4. The method of claim 3, wherein:
storing network flow information further includes
setting a primary table valid bit in the physical entry for each network flow entry.

5. The method of claim 4, wherein:
the primary table has primary table entries that each include "k" data fields, where k is an integer greater than 1;
each aggregation scheme includes a subset "p" of the k data fields, where p<k; and
distinguishing between the first and second data value includes
searching while applying a scheme global mask value that masks all but the p data fields of the k data fields to search the aggregation scheme, and
searching without the scheme global mask value to search the primary table.

6. The method of claim 5, wherein:
the global maskable CAM entries store a primary table and a plurality of aggregation schemes; and
the step of storing network flow information includes
receiving new network flow information,
searching for an existing aggregation scheme entry having a subset of fields that match the new network flow information fields, and
if writing the new network flow information would not alter a field value combination utilized by the existing aggregation scheme entry, storing the new network flow information in the matching CAM entry, and
if writing the new network flow information would alter the field value combination utilized by the existing aggregation scheme entry, storing the new network flow information in an unused CAM entry, if an unused CAM entry is available.

7. The method of claim 3, further including:
receiving a delete command to delete an existing primary table entry and aggregate the data of the primary table entry;
in response to the delete command
for each of a plurality of aggregation schemes, searching for an existing aggregation entry having a subset of fields that match corresponding fields of the primary table entry, and
if an existing aggregation entry cannot be found that has the subset of fields that match corresponding fields of the primary table entry, converting said network flow entry into an aggregation scheme entry.

8. The method of claim 3, further including:
further distinguishing flow entries from aggregation entries according to valid bits in each entry.

9. The method of claim 8, wherein:
the valid bits include
at least one unique bit location corresponding to a primary table for each flow entries, and
at least one bit location unique to each aggregation scheme.

10. The method of claim 9, further including:
accessing associated data for each aggregation entry by generating an offset address according to a scheme value, and adding the offset address to an index value corresponding to a matching aggregation entry.

11. The method of claim 1, wherein:
the first data set includes a first type service designation for a data packet and the second data set includes a second type service designation for the data packet; and
the step of applying the predetermined global mask includes masking all but a desired service type designation to generate packet forwarding data corresponding to the desired service type.

12. The method of claim 11, wherein:
each CAM entry includes a predetermined number of service type bit locations, each bit location corresponding to a different service type designation, each service type bit location having a set state and not set state.

13. The method of claim 12, wherein:
the step of storing at least one data value includes
setting a predetermined service type bit for a plurality of entries to a set state to establish a default service value for the data values of the entries.

14. The method of claim 12, wherein:
each CAM entry further includes at least a destination field that indicates the destination of a data packet.

15. The method of claim 11, further including:
receiving a delete command to delete an existing first data set entry, the delete command indicating matching field values and at least one service type; and
in response to the delete command finding each first data set entry having fields that match the matching fields of the delete command, and
  if the service type designations of the entry do not match all of the at least one service type of the delete command, setting the matching service type designations to a non-set state,
  if all of the service type designations of the entry match the at least one service type of the delete command, deleting the entry.

16. The method of claim 11, further including:
accessing associated data for each aggregation entry by generating an offset address according to the service type designation, and adding the offset address to an index value corresponding to the service designation.

17. The method of claim 11, further including:
receiving a write command indicating matching field values and at least one service type; and
in response to the write command finding an entry having fields that match the matching fields of the write command, and
if the service type designations of the entry do not match the service type of the write command, setting the matching service type designation of the entry to a non-set state.

18. A method for providing multiple data set values with a single set of globally maskable content addressable memory (CAM) entries, comprising the steps of:
storing first data set values in the CAM entries, each data set value comprising a plurality of unique fields; and
utilizing a CAM entry that stores a first data set value to simultaneously store a proxy value for at least one other data set, each proxy value representing a data set value that shares a subset of the unique fields of the first data set values.

19. The method of claim 18, wherein:
storing first data set values includes storing associated data for each first data set value in a first random access memory (RAM) section accessed with a first table offset address value; and
storing associated data for other data set in a corresponding other RAM section accessed with other offset address values unique to each other data set.

20. The method of claim 18, further including:
in one type of read function,
reading RAM data according to the first table address offset values and an index value generated by searching the first data set values; and
in another type of read function,
reading RAM data according to one of the other address offset values and an index value generated by searching proxy values for the other data set of the other address offset value.

21. The method of claim 18, further including:
in one type of data modify operation,
reading old data from a RAM location accessed by one of the address offset values and an index value, and modifying the old data with data from a newly received data packet; and
in another type of data modify operation,
reading old data from a RAM location accessed by one of the other address offset values, and modifying the data with other data read from a RAM location accessed by the first table address offset value.

22. The method of claim 18, wherein:
the first data set values are a primary network flow identification table having a first data set value corresponding to each flow of a monitored data network; and
the at least one other data set value includes at least one data aggregation scheme that aggregates selected values of monitored flows.

23. The method of claim 18, wherein:
the first data set values are packet forwarding values corresponding to one type of network packet transmission service; and
the at least one other data set values are packet forwarding values corresponding to at least one other type of network packet transmission service.

24. A system for searching multiple data set values with a single content addressable memory (CAM) table, comprising:
a CAM section having N globally maskable CAM entries, each CAM entry operable to store N data set values that index to first set associated data, at least one second set associated data, or both first and second set associated data; and
a control section comprising,
an address generator that generates offset addresses corresponding to a predetermined global mask value, the offset addresses including a first data set offset address and a plurality of secondary set offset addresses each corresponding to a different set of associated data.

25. The system of claim 24, further including:
an associated data section comprising
a first section having no more than N entries that store first set associated data, and
at least a second section having no more than N entries for storing second set associated data.

26. The system of claim 24, wherein:
the control section is selected from the group consisting of: an application specific integrated circuit formed on a different integrated circuit than the CAM section, a programmable logic device formed on a different integrated circuit than the CAM section, and a processor executing instructions.

27. The system of claim 24, wherein:

the control section is formed in the same integrated circuit as the CAM section.

28. The system of claim 24, wherein:

each CAM entry includes a plurality of valid bits; and the CAM section includes a global mask register that generates global masks for searching the CAM entries, the global mask register including a global mask corresponding to each valid bit.

29. The system of claim 24, wherein:

each CAM entry comprises a plurality of valid bits; and the control section further includes an input parse section that adds valid bits to received search key data to generate an internal search key applied to the CAM entries.

30. The system of claim 24, wherein:

the control section further includes an address modifier that generates a new address based on an offset address from the address generator and an index value from the CAM section.

31. The system of claim 24, wherein:

the data set values that index to the first set associated data and both the first and second set associated data comprises a primary table, where each data set value defines a network flow; and the data set values that index to the second set of associated data and both the first and second set associated data comprises an aggregation table, where each data set value defines a network flow data aggregation scheme.

32. The system of claim 24, wherein:

the data set values that index to the first set associated data comprises forwarding information for a first type of packet transmission service; and the data set values that index to the second set of associated data comprises forwarding information for a second type of packet transmission service.

* * * * *